(12) United States Patent
Moriyama et al.

(10) Patent No.: US 10,504,861 B2
(45) Date of Patent: Dec. 10, 2019

(54) SEMICONDUCTOR DEVICE WITH OVER PAD METAL ELECTRODE AND METHOD FOR MANUFACTURING THE SAME

(71) Applicant: Renesas Electronics Corporation, Tokyo (JP)

(72) Inventors: Takashi Moriyama, Tokyo (JP); Takashi Tonegawa, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/988,483

(22) Filed: May 24, 2018

(65) Prior Publication Data

US 2019/0006300 A1 Jan. 3, 2019

(30) Foreign Application Priority Data

Jun. 29, 2017 (JP) .................. 2017-127570

(51) Int. Cl.
*H01L 23/00* (2006.01)
*H01L 23/522* (2006.01)
*H01L 23/31* (2006.01)

(52) U.S. Cl.
CPC .......... *H01L 24/05* (2013.01); *H01L 23/3192* (2013.01); *H01L 23/5226* (2013.01); *H01L 24/03* (2013.01); *H01L 24/45* (2013.01); *H01L 24/48* (2013.01); *H01L 2224/0345* (2013.01); *H01L 2224/03452* (2013.01); *H01L 2224/03464* (2013.01); *H01L 2224/04042* (2013.01); *H01L 2224/05016* (2013.01); *H01L 2224/05082* (2013.01); *H01L 2224/05155* (2013.01); *H01L 2224/05556* (2013.01);

(Continued)

(58) Field of Classification Search
CPC ....... H01L 24/05; H01L 23/52; H01L 23/522; H01L 23/5226; H01L 23/5283; H01L 23/53233
See application file for complete search history.

(56) References Cited

U.S. PATENT DOCUMENTS 5,814,557 A * 9/1998 Venkatraman ........ H01L 21/768
257/E21.575
5,930,664 A * 7/1999 Hsu .................... H01L 21/31116
438/612

(Continued)

FOREIGN PATENT DOCUMENTS

JP 2010-157683 A 7/2010
JP 2012-146720 A 8/2012

*Primary Examiner* — William Coleman
(74) *Attorney, Agent, or Firm* — McDermott Will & Emery LLP

(57) ABSTRACT

A semiconductor device and a method for manufacturing the semiconductor device which ensure improved reliability, permit further miniaturization, and suppress the increase in manufacturing cost. The semiconductor device includes: a pad electrode formed in the uppermost wiring layer of a multilayer wiring layer formed over a semiconductor substrate; a surface protective film formed in a manner to cover the pad electrode; an opening made in the surface protective film in a manner to expose the pad electrode partially; and a conductive layer formed over the pad electrode exposed at the bottom of the opening. The thickness of the conductive layer formed over the pad electrode is smaller than the thickness of the surface protective film formed over the pad electrode.

17 Claims, 21 Drawing Sheets

(52) U.S. Cl.
CPC ............... *H01L 2224/05664* (2013.01); *H01L 2224/06135* (2013.01); *H01L 2224/06155* (2013.01); *H01L 2224/45144* (2013.01); *H01L 2224/45147* (2013.01)

(56) References Cited

U.S. PATENT DOCUMENTS

| | | | | |
|---|---|---|---|---|
| 6,218,732 | B1* | 4/2001 | Russell | H01L 24/02 |
| | | | | 257/748 |
| 6,709,965 | B1* | 3/2004 | Chen | H01L 21/76804 |
| | | | | 257/E21.508 |
| 6,800,555 | B2* | 10/2004 | Test | H01L 21/288 |
| | | | | 438/687 |
| 6,924,172 | B2* | 8/2005 | Roche | H01L 21/32134 |
| | | | | 257/E21.309 |
| 7,812,456 | B2* | 10/2010 | Koide | H01L 23/3114 |
| | | | | 257/776 |
| 8,063,489 | B2 | 11/2011 | Shigihara et al. | |
| 9,269,678 | B2* | 2/2016 | Wang | H01L 23/3192 |
| 9,679,858 | B2* | 6/2017 | Sekikawa | H01L 24/05 |
| 9,704,804 | B1* | 7/2017 | West | H01L 23/53223 |
| 9,768,132 | B2* | 9/2017 | Lin | H01L 24/03 |

\* cited by examiner

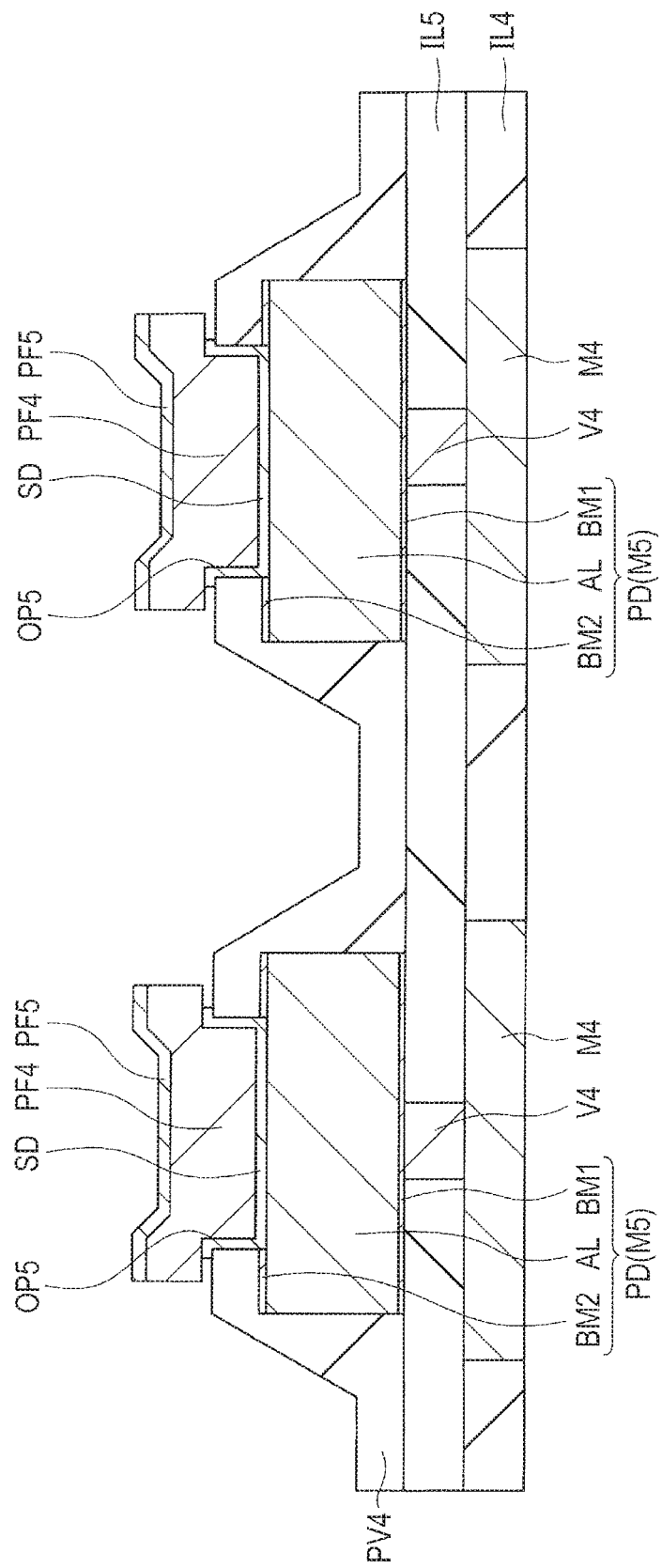

SEMICONDUCTOR DEVICE WITH OVER PAD METAL ELECTRODE AND METHOD FOR MANUFACTURING THE SAME

CROSS-REFERENCE TO RELATED APPLICATIONS

The disclosure of Japanese Patent Application No. 2017-127570 filed on Jun. 29, 2017 including the specification, drawings and abstract is incorporated herein by reference in its entirety.

BACKGROUND

The present invention relates to a semiconductor device and a method for manufacturing the same and more particularly to a technique for a semiconductor device with an OPM electrode and a method for manufacturing the same.

In recent years, in order to meet the demand for enhanced reliability of semiconductor devices, a structure has been proposed in which a conductive layer called an OPM (Over Pad Metal) electrode is formed over a pad electrode as part of the uppermost layer wiring of a multilayer wiring layer over a semiconductor substrate and an external coupling terminal such as a wire bonding is coupled to the OPM electrode.

For example, Japanese Unexamined Patent Application Publication No. 2012-146720 discloses a technique to form an OPM electrode including a nickel film and a palladium film, over an aluminum-based pad electrode by the electroless plating method.

Japanese Unexamined Patent Application Publication No. 2010-157683 discloses a technique to form an OPM electrode including a seed layer, a nickel film and a gold film, in which the seed layer of titanium, etc. is formed over an aluminum-based pad electrode by sputtering and then the nickel film and gold film are formed over the seed layer by the electroplating method using a resist pattern as a mask to make an opening over the pad electrode.

SUMMARY

If the electroless plating method is used to form an OPM electrode as in Japanese Unexamined Patent Application Publication No. 2012-146720, the following problem may arise: the surface of the surface protective film formed between neighboring OPM electrodes is exposed to the plating solution and if there is a foreign substance on the surface protective film, the foreign substance is also plated and the dielectric strength between the neighboring OPM electrodes declines. In order to solve this problem, the distance between neighboring OPM electrodes must be increased. Therefore, it is difficult to achieve both improvement in the reliability of the semiconductor device and further miniaturization of the semiconductor device.

If an OPM electrode as a laminated film made of different metals is formed by making a plurality of plating films over a seed layer by the electroplating method using a resist pattern as in Japanese Unexamined Patent Application Publication No. 2010-157683, the problem arises that one or two plating films of the laminated film may be easily deformed. Another problem is that since the step of making a resist pattern must be added, the manufacturing cost is higher than in the technique disclosed in Japanese Unexamined Patent Application Publication No. 2012-146720.

The above and further objects and novel features of the invention will more fully appear from the following detailed description in this specification and the accompanying drawings.

Some of the main aspects of the present invention which will be disclosed herein are briefly outlined below.

According to one aspect of the present invention, there is provided a semiconductor device which includes: a multilayer wiring layer formed over a semiconductor substrate; a pad electrode formed in the uppermost wiring layer of the multilayer wiring layer; a surface protective film formed in a manner to cover the pad electrode; an opening made in the surface protective film in a manner to expose the pad electrode partially; and a conductive layer formed over the pad electrode exposed at the bottom of the opening. The thickness of the conductive layer formed over the pad electrode is smaller than the thickness of the surface protective film formed over the pad electrode. According to another aspect of the present invention, there is provided a method for manufacturing the above semiconductor device.

According to the present invention, the reliability of the semiconductor device can be improved. Furthermore, the semiconductor device can be further miniaturized. Also, the increase in the semiconductor device manufacturing cost can be suppressed.

BRIEF DESCRIPTION OF THE DRAWINGS

FIG. 21 is a sectional view of the semiconductor device under manufacture or at a manufacturing step following the step shown in FIG. 19.

DETAILED DESCRIPTION

The preferred embodiments of the present invention will be described below in different sections or separately as necessary or for the sake of convenience, but the embodiments described as such are not irrelevant to each other unless otherwise stated. One embodiment may be, in whole or in part, a modified, detailed or supplementary form of another.

Furthermore, in the preferred embodiments described below, when numerical information for an element (the number of pieces, numerical value, quantity, range, etc.) is given by a specific number, it is not limited to the specific number unless otherwise stated or theoretically limited to the specific number. It may be larger or smaller than the specific number.

In the preferred embodiments described below, constituent elements (including constituent steps) are not necessarily essential unless otherwise stated or considered theoretically essential.

Similarly, in the preferred embodiments described below, when a specific form or positional relation is indicated for an element, it should be interpreted to include a form or positional relation which is substantially approximate or similar to the specific form or positional relation unless otherwise stated or theoretically limited to the specific form or positional relation. The same is true for the above numerical information and range.

In all the drawings that illustrate the preferred embodiments, basically the same members are designated by the same reference signs and description thereof is not repeated. For easy understanding, hatching may be used even in a plan view.

<Possible Solutions Considered by the Present Inventors>

Next, how and why the present inventors have come to conceive of the present invention will be explained in reference to the following possible solutions 1 and 2 considered by the present inventors.

Possible Solution 1 is a technique related to Japanese Unexamined Patent Application Publication No. 2012-146720. Next, the problem with the technique of Possible Solution 1 will be explained referring to FIGS. 16 and 17.

Figure 16:
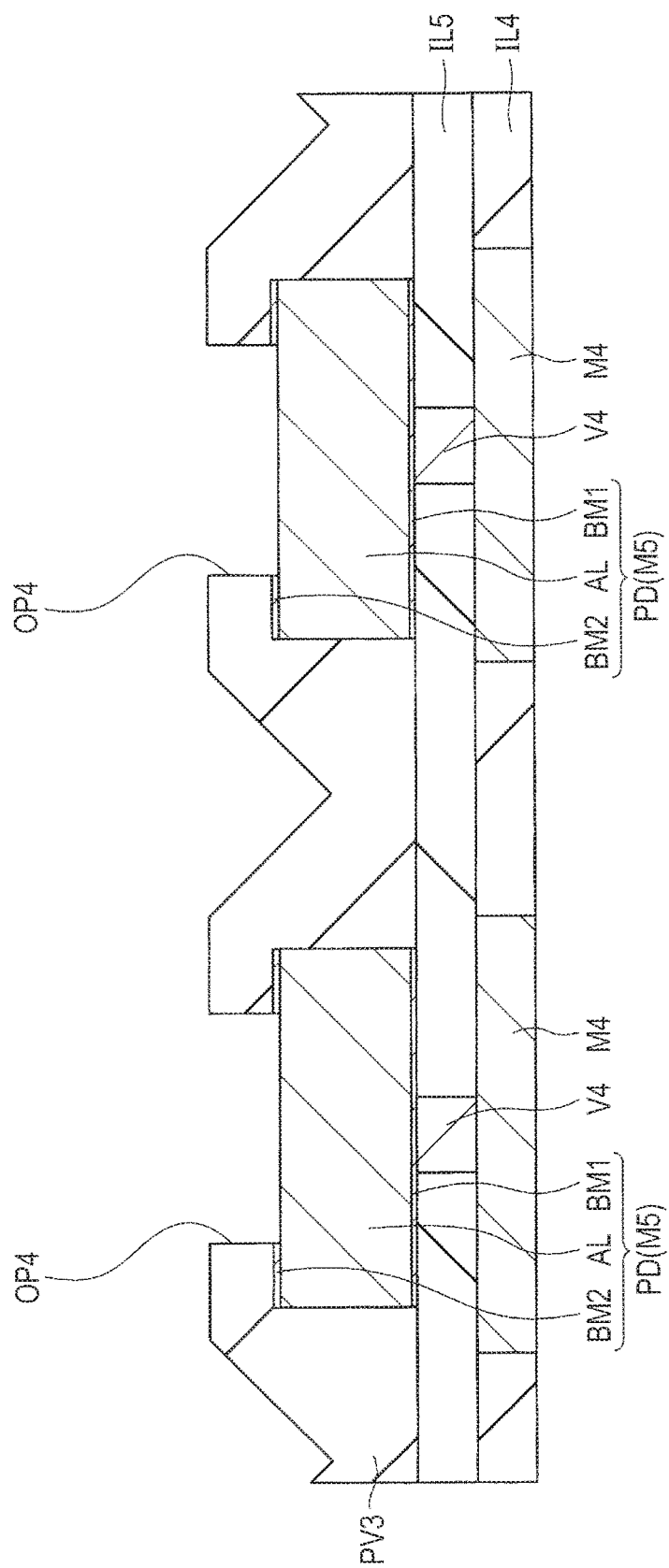
FIG. 16 is a sectional view of a semiconductor device in Possible Solution 1.

As shown in FIG. 16, a pad electrode PD (fifth wiring M5) is formed in the uppermost layer of a multilayer wiring layer and the pad electrode PD is coupled to an underlying fourth wiring M4 through a via V4. A surface protective film PV3 with an opening OP4 made in part of the pad electrode PD is formed over the pad electrode PD.

Figure 17:
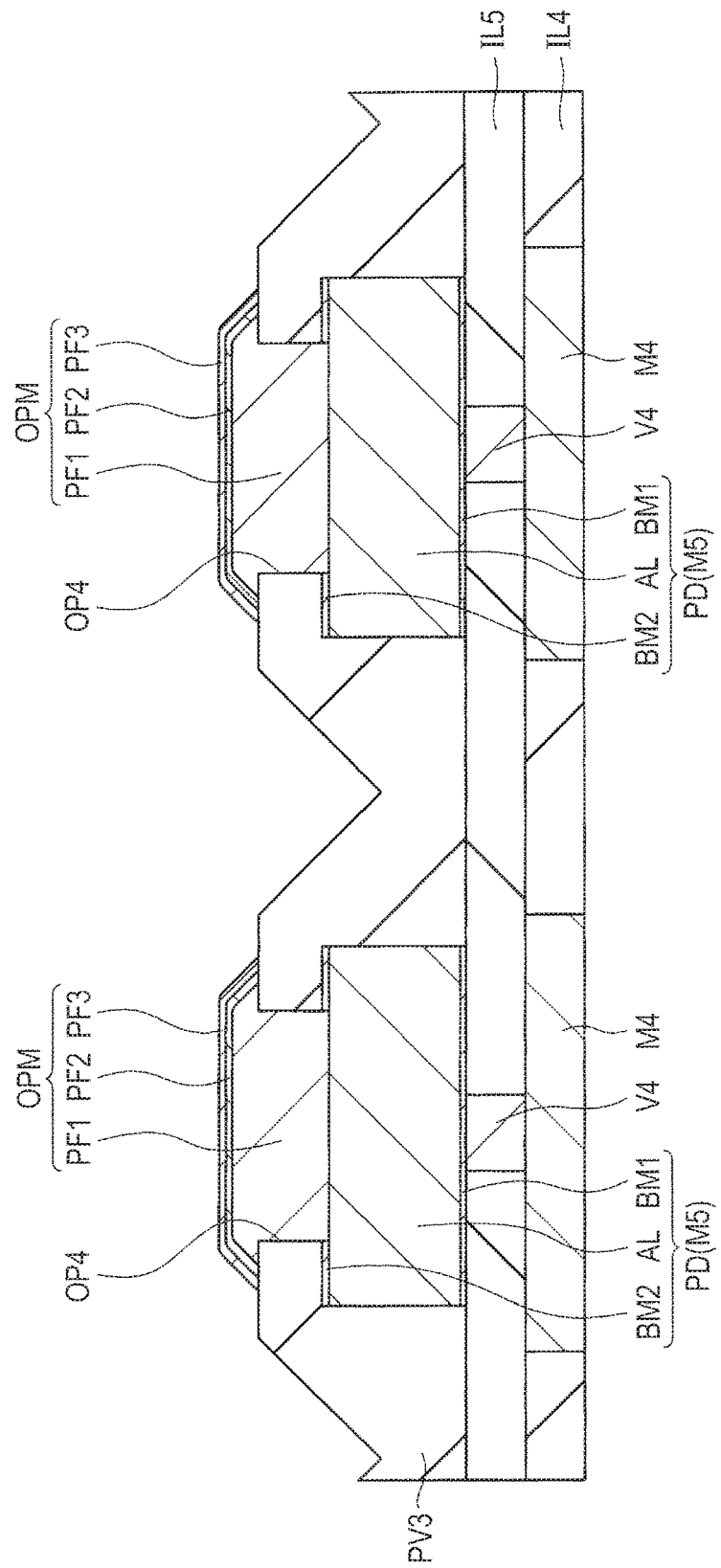
FIG. 17 is a sectional view of the semiconductor device under manufacture or at a manufacturing step following the step shown in FIG. 16.

Then, as shown in FIG. 17, a nickel plating film PF1, palladium plating film PF2, and gold plating film PF3 are sequentially formed over the pad electrode PD exposed from the surface protective film PV3 by the electroless plating method so as to form a conductive layer OPM to become an OPM electrode. The conductive layer OPM lies not only inside the opening OP4 but also over the surface protective film PV3 outside the opening OP4.

From the research by the present inventors, it has been found that if there is an unexpected foreign substance on the surface of the surface protective film PV3, a plating film is formed even on the surface of the foreign substance. Since this unexpected foreign substance is plated and thus electrically conductive, it poses a problem that if the distance between neighboring conductive layers OPM is small, leakage easily occurs. In other words, the dielectric strength between neighboring conductive layers OPM becomes insufficient and thus deterioration over time easily occurs, leading to a decline in the reliability of the semiconductor device. Therefore, as a solution to this problem it is effective to increase the distance between neighboring conductive layers OPM. However, this means an increase in the pitch between neighboring conductive layers OPM, which results in an increase in the chip size of the semiconductor device and makes it difficult to miniaturize the semiconductor device further.

Next, the problem with the technique of Possible Solution 2 will be explained referring to FIGS. 18 to 21. Possible Solution 2 is a technique related to Japanese Unexamined Patent Application Publication No. 2010-157683.

Figure 18:
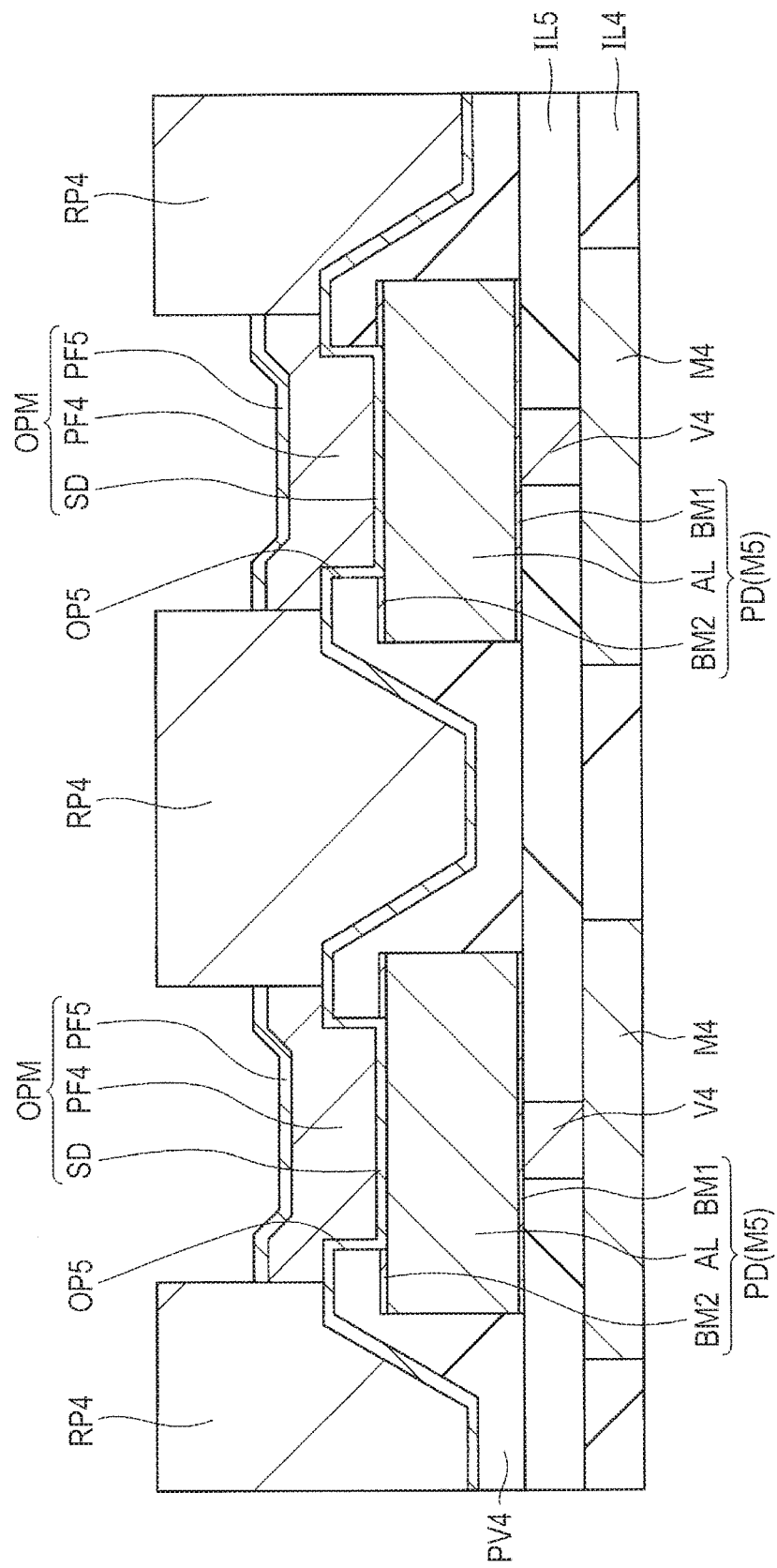
FIG. 18 is a sectional view of a semiconductor device in Possible Solution 2.

As shown in FIG. 18, a pad electrode PD (fifth wiring M5) is formed in the uppermost layer of a multilayer wiring layer and the pad electrode PD is coupled to an underlying fourth wiring M4 through a via V4. A surface protective film PV4 with an opening OP4 made in part of the pad electrode PD is formed over the pad electrode PD. A seed layer SD of titanium, etc. is formed over the pad electrode PD and the surface protective film PV4. A resist pattern RP4 is formed over the seed layer SD in a manner to make an opening in the seed layer SD over the pad electrode PD. Then, a plating film PF4 of nickel, etc. is formed over the seed layer SD exposed from the resist pattern RP4 by the electroplating method. Then, a plating film PF5 of palladium or gold is formed over the plating film PF4. The plating film PF4 and plating film PF5 lie not only inside the opening OP5 but also over the surface protective film PV4 outside the opening OP5.

Figure 19:
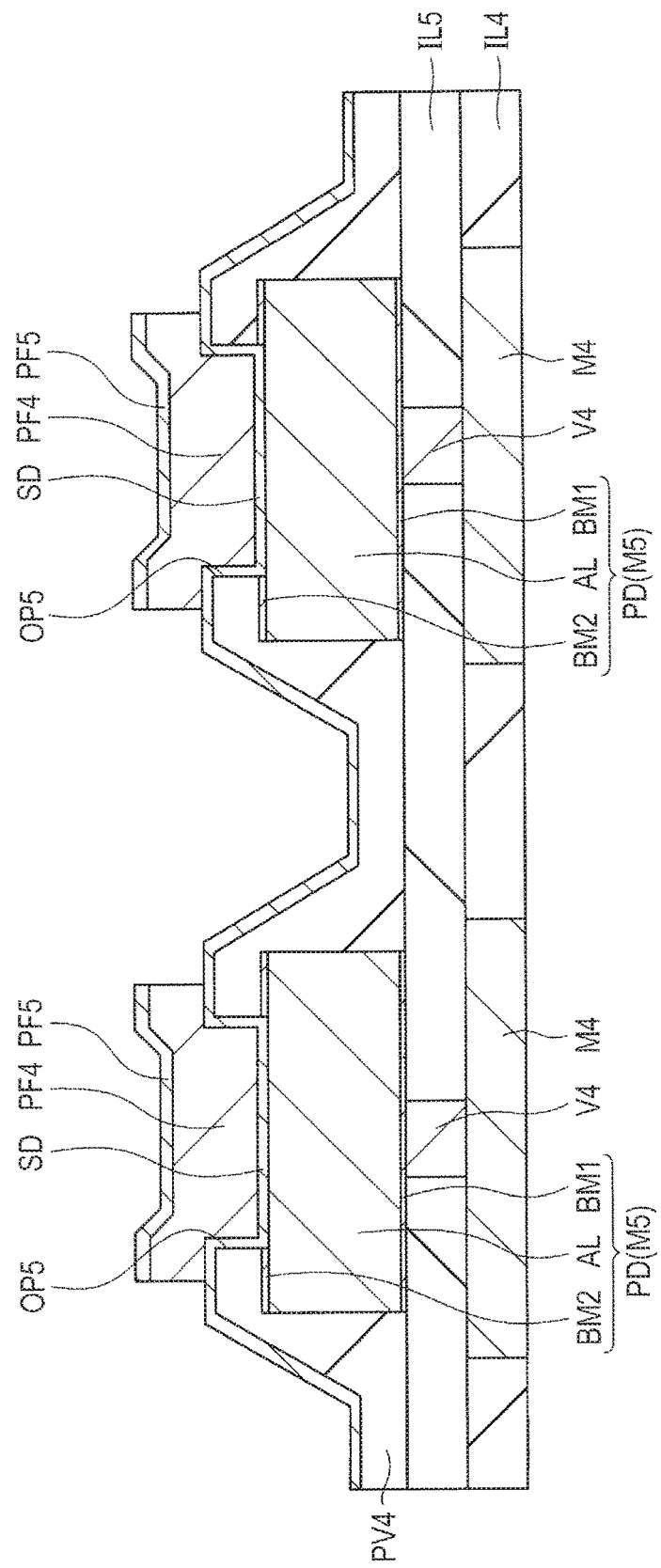
FIG. 19 is a sectional view of the semiconductor device under manufacture or at a manufacturing step following the step shown in FIG. 18.

Then, as shown in FIG. 19, the resist pattern RP4 is removed by ashing so as to expose the portions of the seed layer SD over which the plating film PF4 and plating film PF5 are not formed.

As mentioned above, in Possible Solution 2, during the step of forming the plating film PF4 and plating film PF5, the surface protective film PV4 is covered by the seed layer SD and the resist pattern RP4 lies in areas where the plating film PF4 and plating film PF5 are not formed, so even if a foreign substance is generated over the surface protective film PV4, leakage which may occur in Possible Solution 1 hardly occurs. Therefore, from the viewpoint of the problem about a foreign substance over the surface protective film PV4, the structure proposed by Possible Solution 2 is more advantageous than the structure proposed by Possible Solution 1 in terms of reliability improvement and miniaturization of the semiconductor device.

Figure 20:
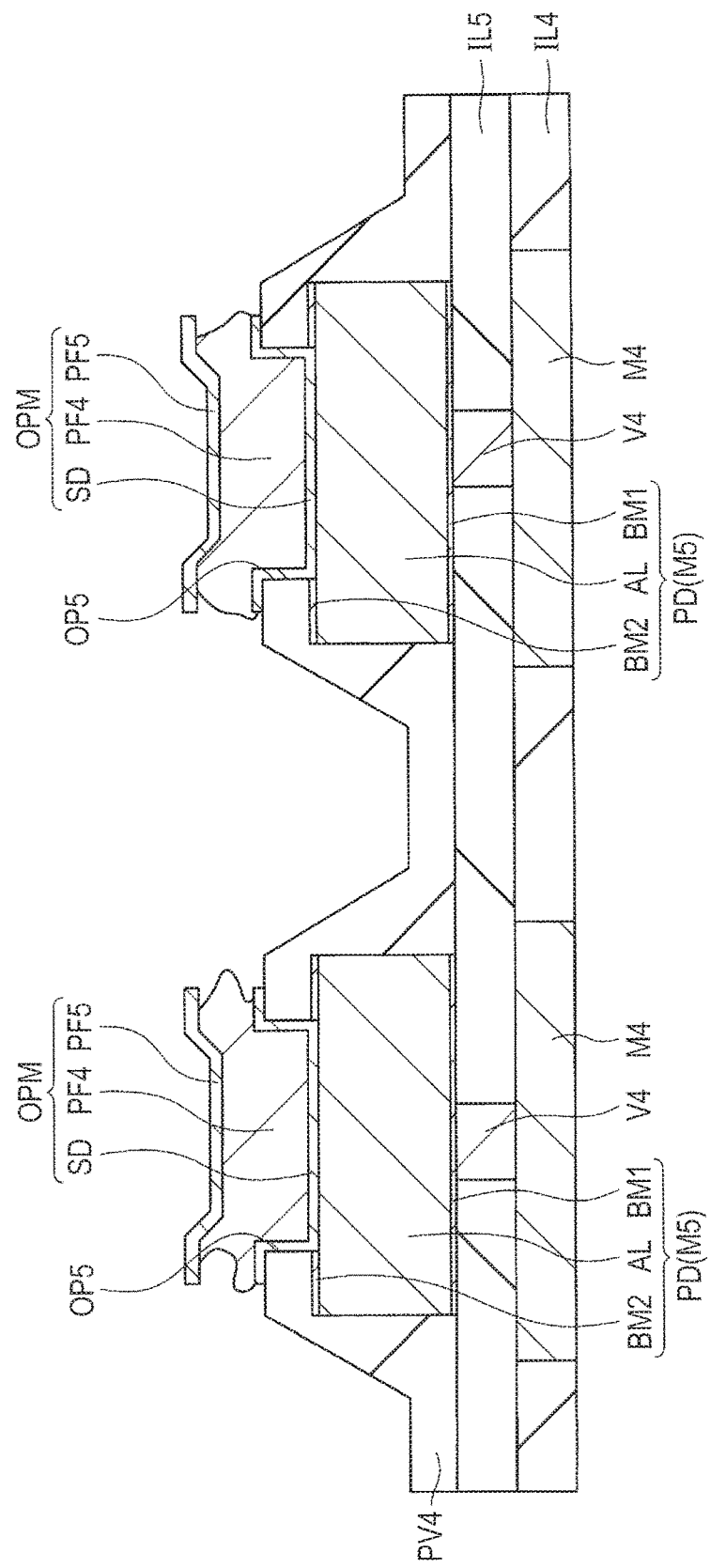
FIG. 20 is a sectional view of the semiconductor device under manufacture or at a manufacturing step following the step shown in FIG. 19.

Then, as shown in FIG. 20, the exposed portion of the seed layer SD from the plating film PF4 and plating film PF5 is removed by wet etching to form a conductive layer OPM which includes the remaining portion of the seed layer SD, the plating film PF4, and the plating film PF5.

Here, the present inventors have found the problem that the wet etching process causes partial deformation of the plating film PF4 or plating film PF5. FIG. 20 shows that the plating film PF4 is partially deformed.

The reason for this problem is that the wet etching solution infiltrates, for example, into the interface between the plating film PF4 and plating film PF5 and the nickel of the plating film PF4 is ionized and begins to melt, resulting in deformation or corrosion of the plating film PF4. This phenomenon is generally called galvanic corrosion. In short, in the structure proposed by Possible Solution 2, the above problem is likely to arise because wet etching is done while the interface between the seed layer SD and plating film PF4 which are made of different metals and the interface between the plating film PF4 and plating film PF5 which are made of different metals are exposed.

Furthermore, if the chemical is changed in order to suppress deformation of the plating film PF4, another problem, such as deformation of the plating film PF5 or the seed layer SD, may arise. FIG. 21 shows a problem which occurs when a chemical to prevent deformation of the plating films PF4 and PF5 is used. As shown in FIG. 21, deformation of the plating films PF4 and PF5 is prevented, but the seed layer SD is retracted inward from the ends of the plating film PF4.

As mentioned above, when several interfaces are exposed at a time, it is difficult to suppress deformation of all the plating films.

Furthermore, in Possible Solution 2, a mask to make a resist pattern RP4 is required, which means an increase in the number of manufacturing steps. Thus, the manufacturing cost of Possible Solution 2 is higher than that of Possible Solution 1.

Therefore, for a semiconductor device with a conductive layer OPM as mentioned above, another approach is needed to achieve further miniaturization, improve the reliability, and suppress the increase in the manufacturing cost.

First Embodiment

Figure 1:
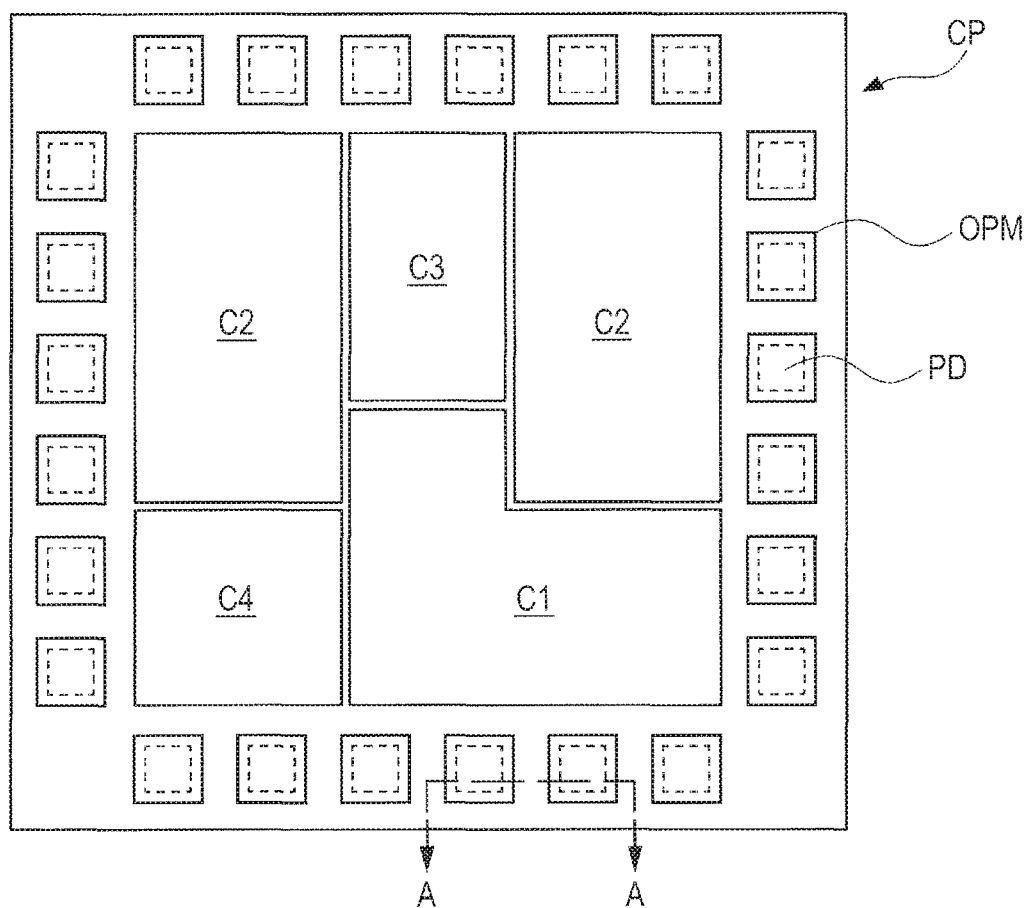
FIG. 1 is a plan view of a semiconductor device.

FIG. 1 is a plan view which shows a rough layout of a semiconductor chip CP as a semiconductor device according to the first embodiment.

The semiconductor chip CP according to this embodiment is, for example, an MCU (Memory Controller Unit) which includes a nonvolatile memory element such as a flash memory and has a rectangular shape in plan view. FIG. 1 shows circuit regions C1 to C4 as regions in which semiconductor elements of circuits for various purposes are formed.

The circuit region C1 is, for example, a CPU (Central Processing Unit) in which a low-voltage MISFET (Metal Oxide Semiconductor Field Effect Transistor) which operates at a relatively low voltage and at high speed is formed as a semiconductor element.

The circuit region C2 is, for example, a nonvolatile memory cell in which a nonvolatile memory element such as a MONOS (Metal Oxide Nitride Oxide Silicon) element is formed as a semiconductor element.

The circuit region C3 is, for example, an SRAM (Static Random Access Memory) in which a low-voltage MISFET having almost the same structure as the circuit region C1 is formed as a semiconductor element.

The circuit region C4 is, for example, an analog circuit in which a high-voltage MISFET with higher dielectric strength than a low-voltage MISFET, a capacitative element, a resistor element, a bipolar transistor and the like are formed as semiconductor elements.

A plurality of pad electrodes PD to be coupled to the semiconductor elements in the circuit regions C1 to C4 through a multilayer wiring layer are arranged in the peripheral area of the semiconductor chip CP, and a conductive layer OPM is formed over each of the pad electrodes PD. In FIG. 1, a conductive layer OPM is indicated by solid line and a pad electrode PD is indicated by broken line.

Figure 2:
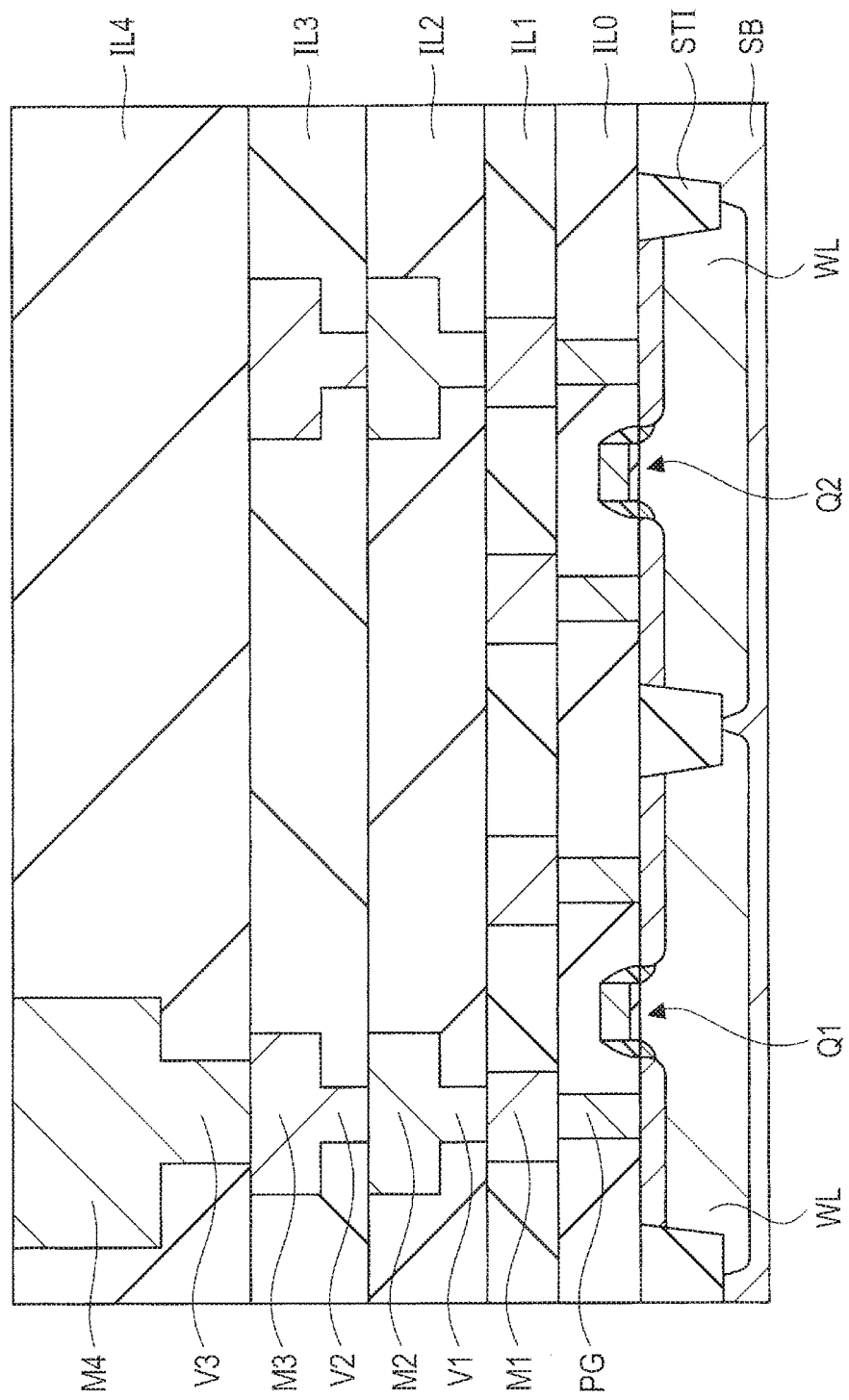
FIG. 2 is a sectional view of a semiconductor device according to a first embodiment of the invention.
Figure 3:
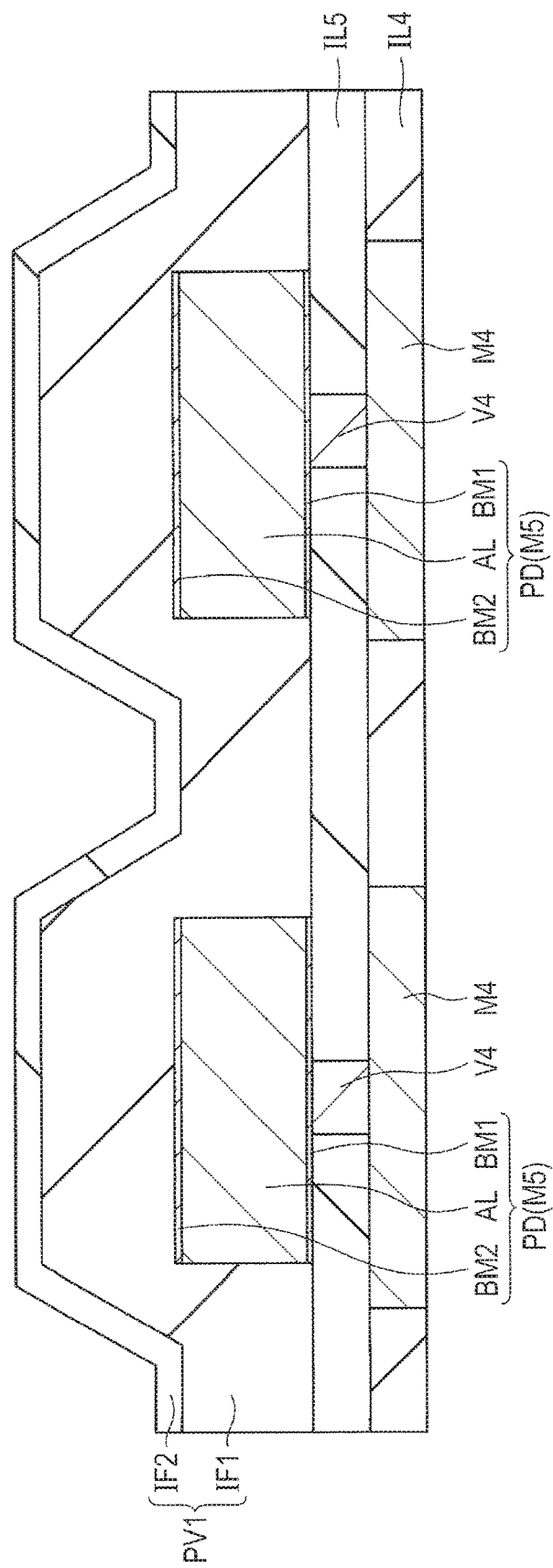
FIG. 3 is a fragmentary sectional view of the semiconductor device according to the first embodiment which is under manufacture or at a manufacturing step following the step shown in FIG. 2.
Figure 4:
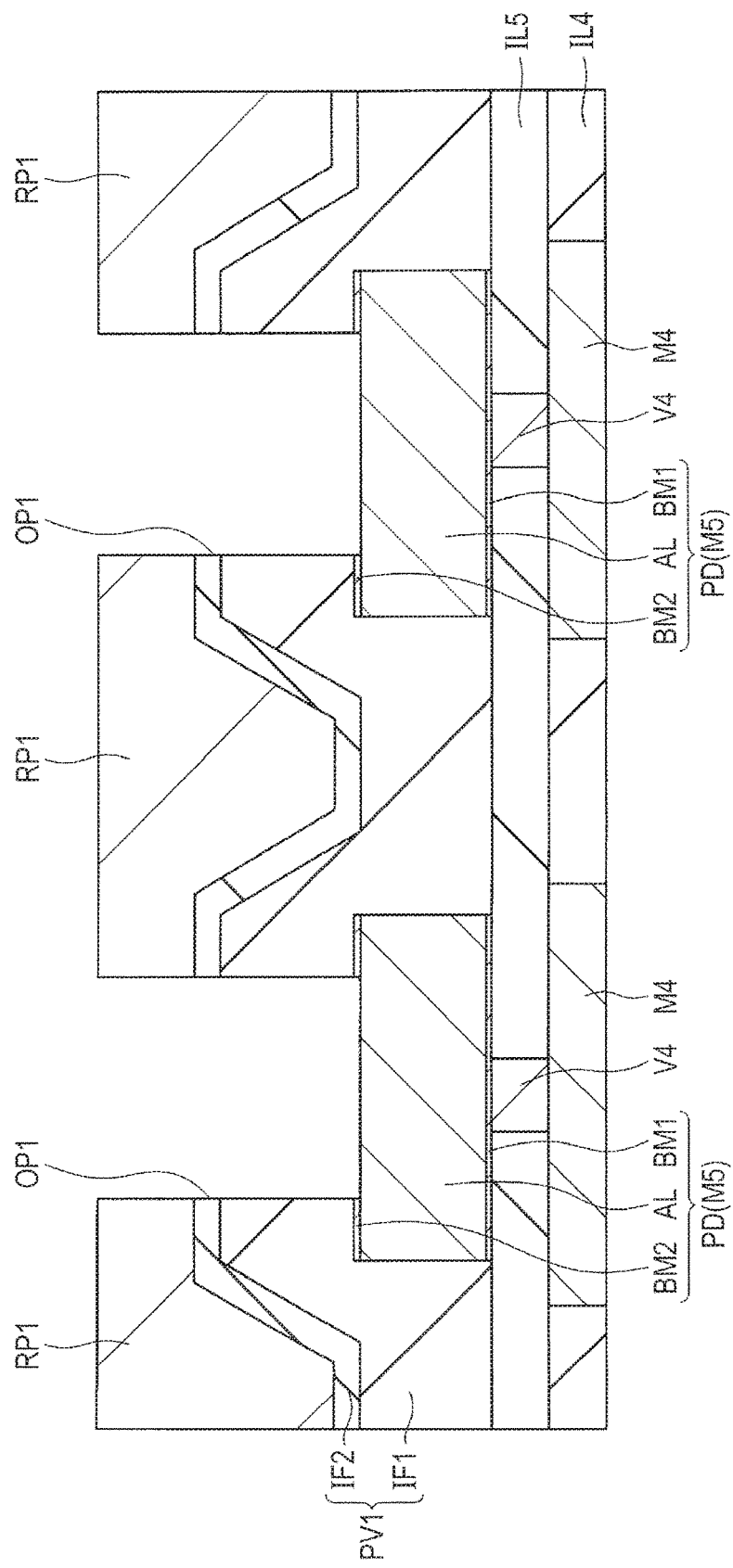
FIG. 4 is a sectional view of the semiconductor device under manufacture or at a manufacturing step following the step shown in FIG. 3.
Figure 5:
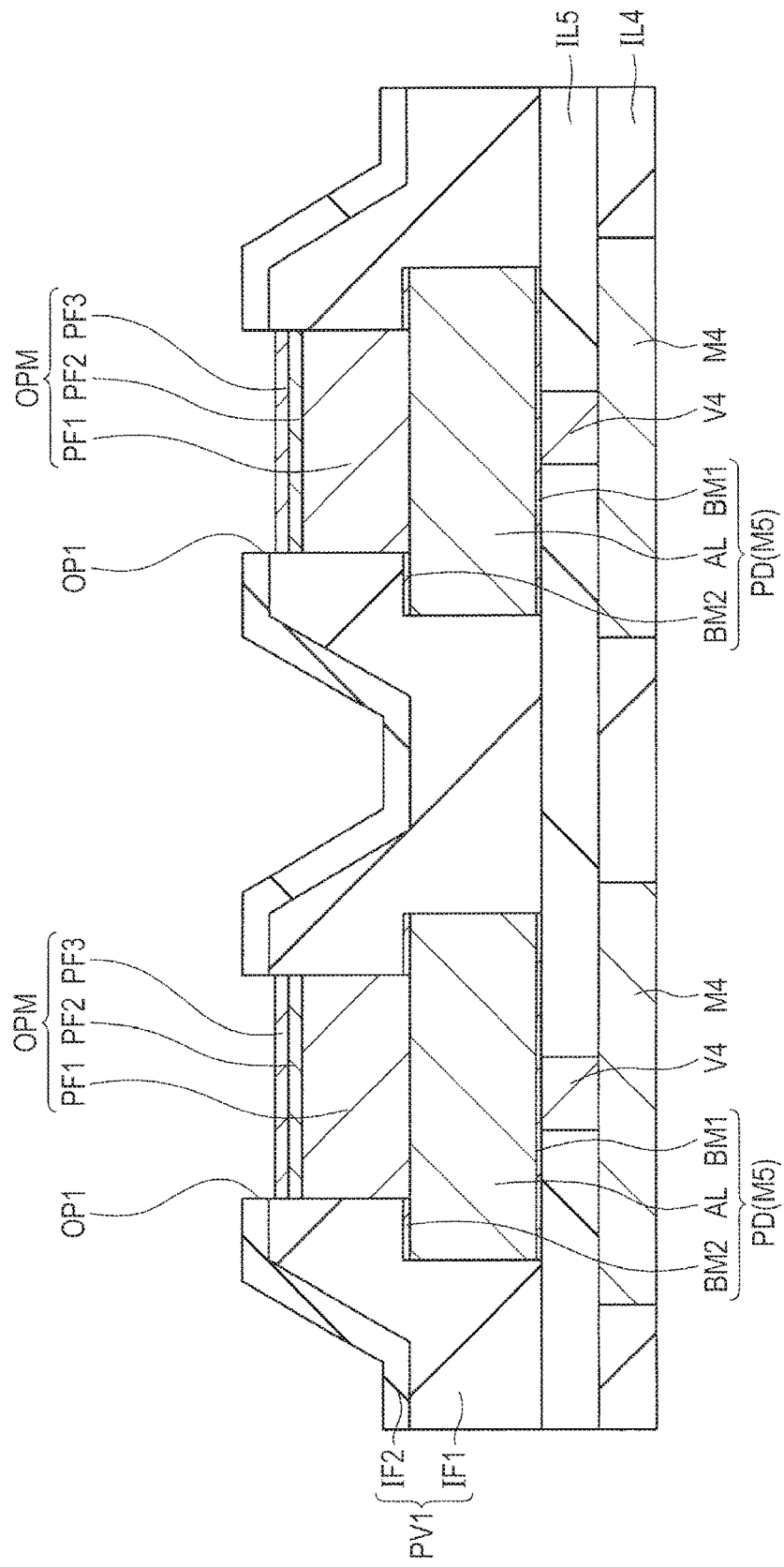
FIG. 5 is a sectional view of the semiconductor device under manufacture or at a manufacturing step following the step shown in FIG. 4.

Next, the features of the structure of the semiconductor device and the manufacturing method according to this embodiment will be described referring to FIGS. 2 to 5. FIG. 2 is a sectional view which shows the fourth wiring M4 and the layers under it. FIGS. 3 to 5 are sectional views taken along the line A-A of FIG. 1, which show the fourth wiring M4 and the layers over it.

In the explanation below, it is assumed that the multilayer wiring layer includes five wiring layers, but the number of stacked wiring layers may be smaller or larger than 5. Since the main features of this embodiment are related to the structure over the multilayer wiring layer and the steps of making the structure, some of the concrete steps of making the semiconductor elements in the vicinity of the main surface of the semiconductor substrate will be omitted.

First, a semiconductor substrate (semiconductor wafer) SB of p-type monocrystalline silicon with a specific resistance of 1 to 10 Ωcm or the like is provided as shown in FIG. 2. Then, a plurality of element isolation parts STI which define an active region are formed in the semiconductor substrate SB. An element isolation part STI is formed, for example, by burying silicon oxide-based insulating film into a trench made in the semiconductor substrate SB.

Then, a well WL is formed by implanting impurities into the semiconductor substrate SB, and then a MISFET Q1 and MISFET Q2 which each include a gate electrode formed over the well WL through a gate insulating film and source/drain regions formed in the well WL are formed. For example, the MISFET Q1 and MISFET Q2 configure a low voltage MISFET in the circuit region C1 shown in FIG. 1.

Then, an interlayer insulating film IL0 to cover the MISFET Q1 and MISFET Q2 is formed over the semiconductor substrate SB. The interlayer insulating film IL0 is, for example, a silicon oxide film which can be formed, for example, by the CVD (Chemical Vapor Deposition) method. Then, a contact hole is made in the interlayer insulating film IL0 by the photolithographic technique and dry etching. Then, a plug PG is formed by burying, for example, tungsten-based metal film into the contact hole. The plug PG is coupled to the MISFET Q1, MISFET Q2 or the like.

Then, an interlayer insulating film IL1 is formed over the interlayer insulating film IL0 in which plugs PG are buried. The interlayer insulating film IL1 is made of a material with a lower permittivity than silicon oxide, for example, carbon-containing silicon oxide such as SiOC. The first wiring M1 is formed by the so-called damascene technique. Specifically, a trench is made in the interlayer insulating film IL1 and for example, copper-based conductive film is buried into the trench by the CMP (Chemical Mechanical Polishing) method to form the first wiring M1. A barrier metal film to prevent diffusion of copper may be formed between the copper and the interlayer insulating film IL1. The first wiring M1 is coupled to the upper surface of the plug PG.

Then, an interlayer insulating film IL2 is formed over the interlayer insulating film IL1 in a manner to cover the first wiring M1. The interlayer insulating film IL2 is made of the same material as the interlayer insulating film IL1. A barrier insulating film, for example, made of silicon carbonitride, which has the function to prevent diffusion of copper, is formed over the surface of the first wiring M1, though not shown in the figure. Then, a via hole and a trench for wiring are made in the interlayer insulating film IL2 and for example, copper-based conductive film is buried into the via hole and trench by the CMP method to form a via V1 and a second wiring M2. In short, the via V1 and second wiring M2 are formed by the dual damascene method as a kind of the damascene method and integrated with each other. A barrier metal film to prevent diffusion of copper may be formed between the copper and the interlayer insulating film IL2. The via V1 is coupled to the upper surface of the first wiring M1.

Then, an interlayer insulating film IL3 is formed over the interlayer insulating film IL2 and second wiring M2. Then, a via V2 and a third wiring M3 are formed in the interlayer insulating film IL3 using the same procedure as when the via V1 and second wiring M2 are formed. Then, an interlayer insulating film IL4 is formed over the interlayer insulating film IL3 and third wiring M3. Then, a via V3 and a fourth wiring M4 are formed in the interlayer insulating film IL4 using the same procedure as when the via V1 and second wiring M2 are formed. The material of the interlayer insulating film IL3 and interlayer insulating film IL4 is the same as that of the interlayer insulating film IL2.

Then, as shown in FIG. 3, an interlayer insulating film IL5 is formed over the interlayer insulating film IL4 in a manner to cover the fourth wiring M4. The interlayer insulating film IL5 is an inorganic insulating film, for example, made of silicon oxide or fluoridated silicon oxide. A barrier insulating film, for example, made of silicon carbonitride, which has the function to prevent diffusion of copper, is formed on the surface of the fourth wiring M4, though not shown in the figure. Then, a via hole is made in the interlayer insulating film IL5 by the photolithographic technique and dry etching. Then, a via V4 is made by burying, for example, tungsten-based metal film into the via hole. The via V4 is coupled to the upper surface of the fourth wiring M4.

Then, a fifth wiring M5 is formed over the interlayer insulating film IL5 as follows. First, a barrier metal film BM1, conductive film AL, and barrier metal film BM2 are sequentially deposited over the interlayer insulating film IL5 by the CVD method or sputtering. Then, patterning is done by the photolithographic technique and dry etching to form the fifth wiring M5. A plurality of fifth wirings M5 are formed in the uppermost layer of the multilayer wiring layer and some of them serve as pad electrodes PD. For example, the barrier metal film BM1 and barrier metal film BM2 are each a titanium nitride film or a laminated film including a titanium nitride film and a titanium film. The conductive film AL is an aluminum-based conductive film. The thickness of the barrier metal film BM1 is about 30 to 150 nm, the thickness of the conductive film AL is about 1500 to 2500 nm, and the thickness of the barrier metal film BM2 is about 30 to 150 nm. The fifth wiring M5 (pad electrode PD) is coupled to the upper surface of the via V4. The barrier metal film BM2 is mainly intended to function as an antireflection film when the photolithographic technique is used, but if the plane area of the pad electrode PD is large enough, the barrier metal film BM2 is omissible.

Then, a surface protective film PV1 is formed over the interlayer insulating film IL5 in a manner to cover the fifth wiring M5. In this embodiment, the surface protective film PV1 is a laminated film which includes an insulating film IF1 and insulating film IF2. The insulating film IF1 is formed, for example, by the HDP (High Density Plasma)-CVD method and for example, made of silicon oxide. The insulating film IF2 is formed, for example, by the CVD method and for example, made of silicon nitride. The thickness of the insulating film IF1 is about 1500 to 2500 nm and the thickness of the insulating film IF2 is about 500 to 700 nm.

The material of the insulating film IF1 or insulating film IF2 is not limited to silicon oxide or silicon nitride, but it may be silicon oxynitride or silicon oxycarbide or an organic resin such as polyimide. However, in the case of polyimide, at the later step of making an opening OP1, when the photosensitive polyimide film is exposed to light to make an opening OP1 in the polyimide film, high processing accuracy cannot be ensured. Therefore, it is better to make an opening OP1 by patterning silicon oxide, silicon nitride, silicon oxynitride, or silicon oxycarbide by the photolithographic technique.

In this embodiment, the surface protective film PV1 is described as a laminated film which includes the insulating film IF1 and insulating film IF2. However, instead, the surface protective film PV1 may be a monolayer film which includes only one of the insulating films. Regardless of whether it is either a monolayer film or laminated film, the thickness of the surface protective film PV1 should be about 2000 to 3200 nm. As will be explained in detail later, it is important that the thickness of the surface protective film PV1 (sum of the thicknesses of the insulating films IF1 and IF2) should be larger than the thickness of the conductive layer OPM.

Here, the "thickness of the surface protective film (PV1, etc.)" means "thickness upward from the surface of the pad electrode PD" and more specifically, in this embodiment it means "thickness upward from the surface of the barrier metal film BM2". If the barrier metal film BM2 is not formed, the "thickness of the surface protective film (PV1, etc.)" means "thickness upward from the surface of the conductive film AL".

Then, as shown in FIG. 4, a resist pattern RP1 is formed over the surface protective film PV1 in a manner to make an opening in part of the pad electrode PD. Then, the insulating film IF2, insulating film IF1, and barrier metal film BM2 are sequentially removed by dry etching using the resist pattern RP1 as a mask. Consequently, an opening OP1 is made in the surface protective film PV1 and the surface of the conductive film AL is exposed at the bottom of the opening OP1.

Then, the resist pattern RP1 is removed by ashing.

Then, as shown in FIG. 5, for example, a nickel (Ni)-based conductive film PF1, for example, a palladium (Pd)-based conductive film PF2, and for example, a gold (Au)-based conductive film PF3 are sequentially formed over the exposed surface of the conductive film AL by the electroless plating method so as to form a conductive layer OPM as a laminated film which includes these plating films. Alternatively, the conductive layer OPM may be a laminated film which includes the conductive film PF1 and conductive film PF3 or a laminated film which includes the conductive film PF1 and conductive film PF2. The conductive film PF1 and conductive film PF2 may contain phosphor (P).

The thickness of the conductive film PF1 is about 1800 to 2250 nm, the thickness of the conductive film PF2 is about 100 to 400 nm, and the thickness of the conductive film PF3 is about 20 to 150 nm. Thus, the thickness of the conductive layer OPM is about 1920 to 2800 nm.

The conductive layer OPM is a region for coupling to an external coupling terminal WB such as a wire bonding of gold or copper, which is mainly intended to cushion the shock at the time of bonding a wire bonding. In recent years, inexpensive copper wire with high hardness has been used for a wire bonding and the degree of shock is higher than before, so the conductive layer OPM is becoming more important.

Since the conductive film PF1 is a main film of the conductive layer OPM, preferably it should be made of a material with a low sheet resistance. The conductive film PF3 is mainly intended to improve bondability to the external coupling terminal WB and preferably it should be made of a material with a higher bondability to the external coupling terminal WB than the conductive film PF1. The conductive film PF2 is intended to prevent the conductive film PF1 from spreading to the surface of the conductive film PF3, causing corrosion in the boundary between the conductive film PF1 and conductive film PF3.

The semiconductor device according to the first embodiment is manufactured through the above steps.

Figure 6:
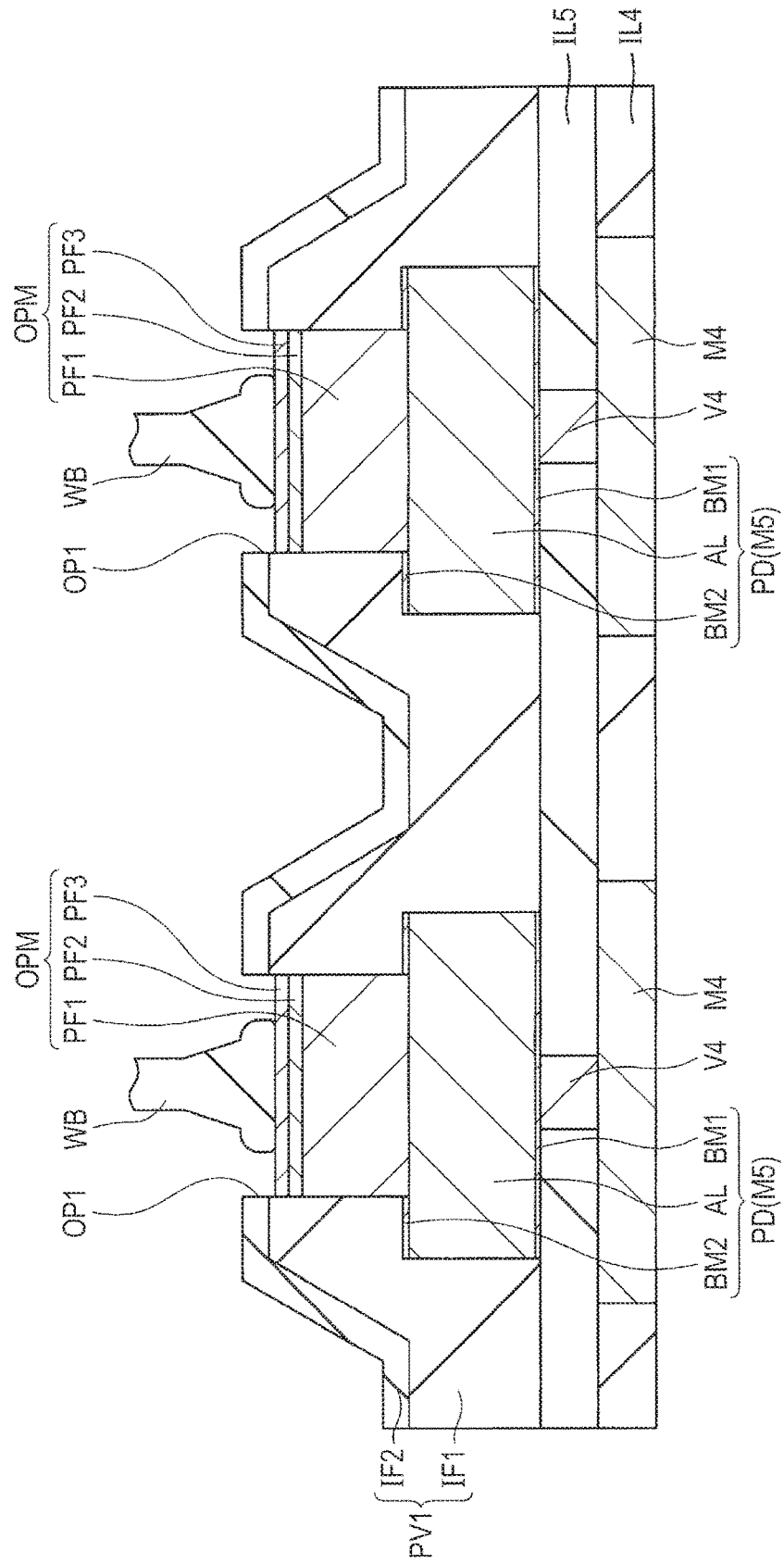
FIG. 6 is a sectional view of the semiconductor device under manufacture or at a manufacturing step following the step shown in FIG. 5.

Then, as shown in FIG. 6, in the back-end process, after the semiconductor substrate SB is cut into individual semiconductor chips CP by dicing, etc., an external coupling terminal WB is formed over the conductive layer OPM. The external coupling terminal WB is, for example, a wire bonding of copper or gold.

<Main Features of the Semiconductor Device According to the First Embodiment>

A main feature of the semiconductor device according to the first embodiment is that the thickness of the conductive layer OPM over the pad electrode PD is smaller than the thickness of the surface protective film PV1 (sum of the thicknesses of the insulating film IF1 and insulating film IF2). In other words, the conductive layer OPM lies only inside the opening OP1 and does not lie over the surface protective film PV1 outside the opening OP1. For this reason, the effective distance between neighboring conductive layers OPM can be increased.

For example, if the thickness of the surface protective film PV1 is 2500 nm and the thickness of the conductive layer OPM is 2000 nm, the thickness difference is 500 nm. This means that the effective distance between neighboring conductive layers OPM is the distance from the uppermost surface of an end of one of the conductive layers OPM to the uppermost surface of an end of the other conductive layer OPM plus twice the above thickness difference (500 nm). In this case, the effective distance is larger than in the structure proposed by Possible Solution 1 by the amount equivalent to twice the thickness difference (500 nm).

Possible Solution 1, which uses the same electroless plating method as in this embodiment, has the problem that a foreign substance may be generated over the surface protective film PV3 and the foreign substance may be plated, thereby causing leakage to occur easily. If so, the dielectric strength between neighboring conductive layers OPM would be insufficient and deterioration over time would be likely to occur and it is thus necessary to increase the distance between neighboring conductive layers OPM. This poses a problem that the chip size of the semiconductor device should be larger in order to increase the distance (pitch) between conductive layers OPM. In short, it is difficult to achieve both improvement in the reliability of the semiconductor device and further miniaturization of the semiconductor device.

In contrast, in this embodiment, due to the thickness difference between the surface protective film PV1 and conductive layer OPM, the effective distance between neighboring conductive layers OPM can be increased, so the reliability of the semiconductor device can be improved without the need for changing the pitch between conductive layers OPM.

By further increasing the thickness difference between the surface protective film PV1 and the conductive layer OPM, the effective distance between neighboring conductive layers OPM is further increased. For example, if the thickness difference is increased from 500 nm to 800 nm, the effective distance is further increased by twice as much as 300 nm. This means that the pitch between conductive layers OPM can be decreased by 600 nm. In other words, further miniaturization of the semiconductor device can be achieved while ensuring the reliability of the semiconductor device.

A comparison between Possible Solution 1 and the first embodiment is made below on the assumption that the plane area of the opening OP4 in Possible Solution 1 is the same as the plane area of the opening OP1 in this embodiment. In the structure proposed by Possible Solution 1, the conductive layer OPM lies over the surface protective film PV3. In contrast, in this embodiment, the conductive layer OPM lies only inside the opening OP1 and does not lie over the surface protective film PV1 outside the opening OP1. Therefore, because the conductive layer OPM in Possible Solution 1 lies over the surface protective film PV3, the effective distance is larger in this embodiment than in Possible Solution 1. Thus, the structure according to this embodiment can improve the reliability of the semiconductor device more than the structure in Possible Solution 1.

Another comparison is made below on the assumption that the plane area of the conductive layer OPM in Possible Solution 1 is the same as the plane area of the conductive layer OPM in this embodiment. In this embodiment, the plane area of the conductive layer OPM is the same as the diameter of the opening OP1. In contrast, in Possible Solution 1, the conductive layer OPM lies over the surface protective film PV3 and thus the diameter of the opening OP4 is smaller than the diameter of the opening OP1 in this embodiment. Therefore, the area of contact between the pad electrode PD and the conductive layer OPM in this embodiment is larger than that in Possible Solution 1. Therefore, in terms of the adhesiveness between the pad electrode PD and the conductive layer OPM and the contact resistance between the pad electrode PD and the conductive layer OPM, this embodiment is better than Possible Solution 1. In short, this embodiment can improve the reliability of the semiconductor device more than Possible Solution 1.

Furthermore, in this embodiment, since the conductive layer OPM lies only inside the opening OP1, the side surfaces of the conductive layer OPM are not exposed like Possible Solution 2. Specifically, the interface between the conductive film PF1 and conductive film PF2 and the interface between the conductive film PF2 and conductive film PF3 are not exposed. Therefore, even if the semiconductor device according to this embodiment is exposed to the atmospheric air or cleaning solution, deformation or corrosion of the conductive films PF1 to PF3 is less likely to occur. In other words, since the semiconductor device according to this embodiment has a structure which hardly causes galvanic corrosion, the reliability of the semiconductor device can be improved.

Another feature of the semiconductor device according to this embodiment is an advantage that the thickness and plane area of the conductive layer OPM can be easily controlled.

In Possible Solution 1, the conductive layer OPM lies not only inside the opening OP4 but also outside the opening OP4. Basically, in the electroless plating method, the conductive films PF1 to PF3 as plating films are formed by reductive reaction between the conductive film AL of the pad electrode PD and the plating solution. Since the insulating film of silicon nitride, etc. which configures the surface protective film PV3 does not reductively react with the plating solution, a plating film is not formed over the silicon nitride film. However, as the plating film grows beyond the top of the opening OP4, the plating film slightly grows isotropically in the vertical and horizontal directions. Consequently, the plating film protrudes from the surface protective film PV3. Therefore, in the electroless plating method, the thickness and plane area of the plating film can be controlled relatively accurately.

However, the thickness and plane area of the plating film protruding from the surface protective film PV3 may be considered to depend on the surface condition of the surface protective film PV3. If there is a conductive foreign substance as described in connection with Possible Solution 1 over the surface protective film PV3, the plating film may grow with the foreign substance as a nucleus. This may result in variation in thickness and plane area among the plating films formed over the electrode pads PD, namely variation in thickness and plane area among the conductive layers OPM.

In contrast, in this embodiment, the conductive layer OPM lies only inside the opening OP1 and does not lie over the surface protective film PV1 outside the opening OP1. This eliminates the need to consider variation in thickness and plane area among conductive layers OPM which might occur if the plating film should grow over the surface protective film PV1. In short, since each conductive layer OPM lies only inside the opening OP1, the thickness and plane area of each conductive layer OPM is more controllable. Therefore, the reliability of the semiconductor device can be improved.

A further feature of the semiconductor device according to this embodiment is an advantage that the manufacturing cost can be reduced easily.

In Possible Solution 2, the seed layer SD is formed inside the opening OP5 and over the surface protective film PV4 outside the opening OP5, the resist pattern RP4 is formed over the seed layer SD, and the plating film PF4 and plating film PF5 are formed over the portion of the seed layer SD which is exposed from the resist pattern RP4. Thus, the influence of a foreign substance over the surface protective film PV4 is small and leakage as described in connection with Possible Solution 1 hardly occurs. Therefore, it is unnecessary to decrease the pitch between conductive layers OPM in consideration of the influence of a foreign substance, so Possible Solution 2 is more advantageous than Possible Solution 1 from the viewpoint of miniaturization and reliability improvement of the semiconductor device.

On the other hand, in this embodiment, it is unnecessary to form the seed layer and resist pattern RP4 as in Possible Solution 2 and the manufacturing cost can be almost the same as in Possible Solution 1. In addition, as mentioned above, this embodiment is more advantageous than Possible Solution 1 from the viewpoint of miniaturization and reliability improvement of the semiconductor device. Therefore, according to this embodiment, the semiconductor device can be further miniaturized, the reliability of the semiconductor device can be improved, and the cost of manufacturing the semiconductor device can be suppressed.

Another feature of this embodiment concerning suppression of the manufacturing cost is described below.

In some cases, a conductive layer OPM is not formed and a wire bonding is formed directly on the pad electrode PD according to the product specification requested by the customer. In connection with this, in this embodiment, an additional mask is not needed regardless of whether a conductive layer OPM is used or not. If a conductive layer OPM is used, only the step of forming conductive films PF1 to PF3 over the pad electrode PD by the electroless plating method has to be added.

In contrast, in Possible Solution 1, the plane area of the conductive layer OPM depends on the diameter of the opening OP4. If there is a customer request not to form a conductive layer OPM, the diameter of the opening OP4 must be increased in order to obtain an area for contact with a wire bonding and thus the same mask as the mask for forming a conductive layer OPM cannot be used.

For the above reason, the semiconductor device according to this embodiment can minimize the increase in the manufacturing cost.

Variation 1 of the First Embodiment

Variation 1 of the first embodiment will be described referring to FIG. 7.

Figure 7:
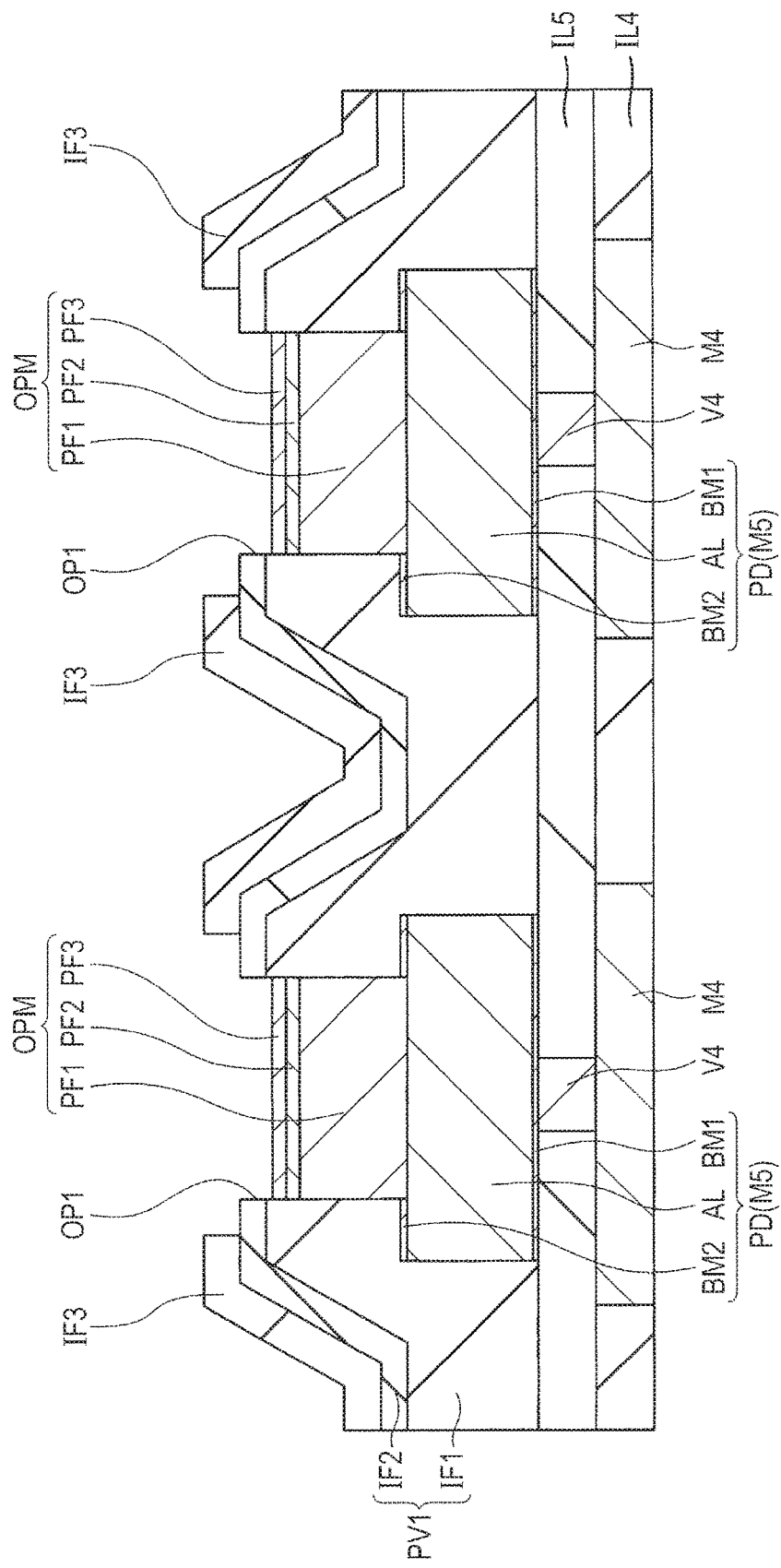
FIG. 7 is a sectional view of a semiconductor device according to Variation 1 of the first embodiment.

As shown in FIG. 7, an insulating film IF3, for example, of silicon oxide, silicon nitride, silicon oxynitride or silicon oxycarbide is added to the semiconductor device according to the first embodiment shown in FIG. 5.

Next, the manufacturing method according to Variation 1 of the first embodiment will be described.

First, plasma treatment using, for example, argon (Ar) as an inert gas is made on the surface of the surface protective film PV1. This plasma treatment, assuming that a foreign substance is generated on the surface of the surface protective film PV1 and the foreign substance is plated, is intended to remove the plated foreign substance as far as possible.

Then, an insulating film IF3 is formed over the surface protective film PV1 and over the conductive layer OPM by the CVD method. Then, the insulating film IF3 is selectively removed so as to expose the conductive layer OPM by the photolithographic method and dry etching. Consequently, the semiconductor device as shown in FIG. 7 is produced.

The step of forming an insulating film IF3 by the CVD method as mentioned above is successively carried out in the same chamber as the preceding step for plasma treatment. This eliminates the possibility that when the plasma-treated semiconductor device is taken out of the chamber, the surface protective film PV1 is exposed to the atmospheric air and a foreign substance is newly generated over the surface protective film PV1. In other words, the insulating film IF3 is formed while the surface of the surface protective film PV1 is still clean, so the required dielectric strength between neighboring conductive layers OPM is ensured.

Furthermore, since the effective distance between neighboring conductive layers OPM is further increased by the amount equivalent to the thickness of the insulating film IF3, the reliability of the semiconductor device can be further improved.

Furthermore, in Variation 1 of the first embodiment, the ends of the insulating film IF3 lie over the surface protective film PV1 and are positioned in a manner to expose the conductive layer OPM. Therefore, when forming the external coupling terminal WB shown in FIG. 6, the area in which the external coupling terminal WB is to be formed is not decreased.

After the above plasma treatment, an organic resin film such as a polyimide film may be formed instead of the insulating film IF3. However, from the viewpoint of further improving the reliability of the semiconductor device, a film which can be formed by the CVD method in succession to plasma treatment, like the insulating film IF3, is more preferable.

Variation 2 of the First Embodiment

Next, Variation 2 of the first embodiment will be described referring to FIG. 8.

Figure 8:
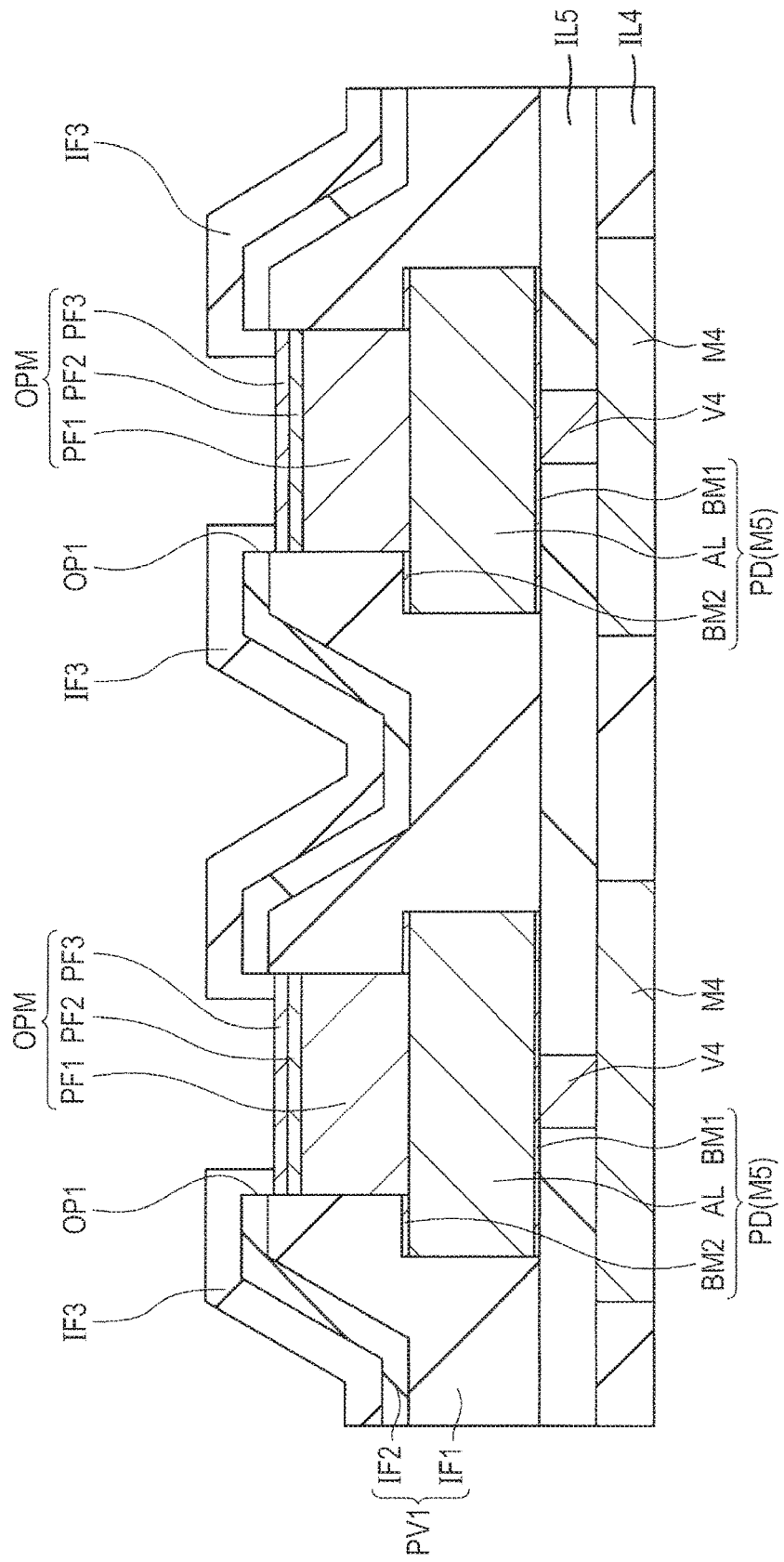
FIG. 8 is a sectional view of a semiconductor device according to Variation 2 of the first embodiment.

As shown in FIG. 8, in Variation 2 of the first embodiment too, an insulating film IF3 is formed as in Variation 1 of the first embodiment. Specifically, plasma treatment is also made on the surface of the surface protective film PV1 in Variation 2 of the first embodiment. Then, an insulating film IF3 is formed over the surface protective film PV1 by the CVD method. The step of forming an insulating film IF3 by the CVD method as mentioned above is successively carried out in the same chamber as the preceding step for plasma treatment. Therefore, the semiconductor device according to Variation 2 of the first embodiment brings about the same advantageous effects as the semiconductor device according to Variation 1 of the first embodiment.

Variation 2 of the first embodiment is different from Variation 1 of the first embodiment in that the ends of the insulating film IF3 lie over the conductive layer OPM. In other words, the insulating film IF3 is formed in a manner to cover part of the conductive layer OPM and the surface protective film PV1. This suppresses, for example, the possibility that the semiconductor device is exposed to the atmospheric air and moisture or the like in the atmospheric air infiltrates between the surface protective film PV1 and the conductive layer OPM, in a more convincing way. In other words, this suppresses infiltration of moisture or the like in the interface between the conductive films PF1 and PF2 and the interface between the conductive films PF2 and PF3 in a more convincing way. Specifically, while the semiconductor device according to the first embodiment already has a structure which prevents exposure of these interfaces and thereby provides high resistance to galvanic corrosion, etc., Variation 2 of the first embodiment has a structure which further reduces the pathway through which moisture or the like may infiltrate. Therefore, the reliability of the semiconductor device can be further improved.

In Variation 2 of the first embodiment, the area in which an external coupling terminal WB is to be formed is smaller than in Variation 1 of the first embodiment and in order to provide the same plane area for an external coupling terminal WB as in Variation 1 of the first embodiment, it is necessary to take some measure, such as increasing the plane areas of the pad electrode PD and conductive layer OPM. From this viewpoint, the structure according to Variation 1 of the first embodiment is more advantageous than the structure according to Variation 2 of the first embodiment.

However, if the plane areas of the pad electrode PD and conductive layer OPM can be large enough or priority is placed on the reliability of the semiconductor device, the structure according to Variation 2 of the first embodiment is more advantageous than the structure according to Variation 1 of the first embodiment.

Second Embodiment

The structure of the semiconductor device according to the second embodiment and the method for manufacturing the same will be described referring to FIGS. 9 to 13. FIGS. 9 to 13 are fragmentary sectional views of the semiconductor device, taken along the line A-A of FIG. 1 as in the first embodiment.

In the first embodiment, the surface protective film PV1 is processed using one resist pattern RP1 as shown in FIG. 4. If the surface protective film PV1 is a laminated film which includes an insulating film IF1 and an insulating film IF2, both the insulating films IF1 and IF2 are processed using the same resist pattern RP1.

A main feature of the second embodiment is that in order to further improve the reliability of the semiconductor device, the insulating film IF1 is first processed and then the insulating film IF2 is processed so that the insulating film IF2 covers the side surfaces of the barrier metal film BM2.

Next, the method for manufacturing the semiconductor device according to the second embodiment will be described.

The process from the steps of completing the work-in-process shown in FIG. 2 until the step of forming the interlayer insulating film IL5, the step of forming the via V4, and the step of forming the fifth wiring M5 (pad electrode PD) which are illustrated in FIG. 3 is the same as in the first embodiment, so description of these steps is omitted.

Figure 9:
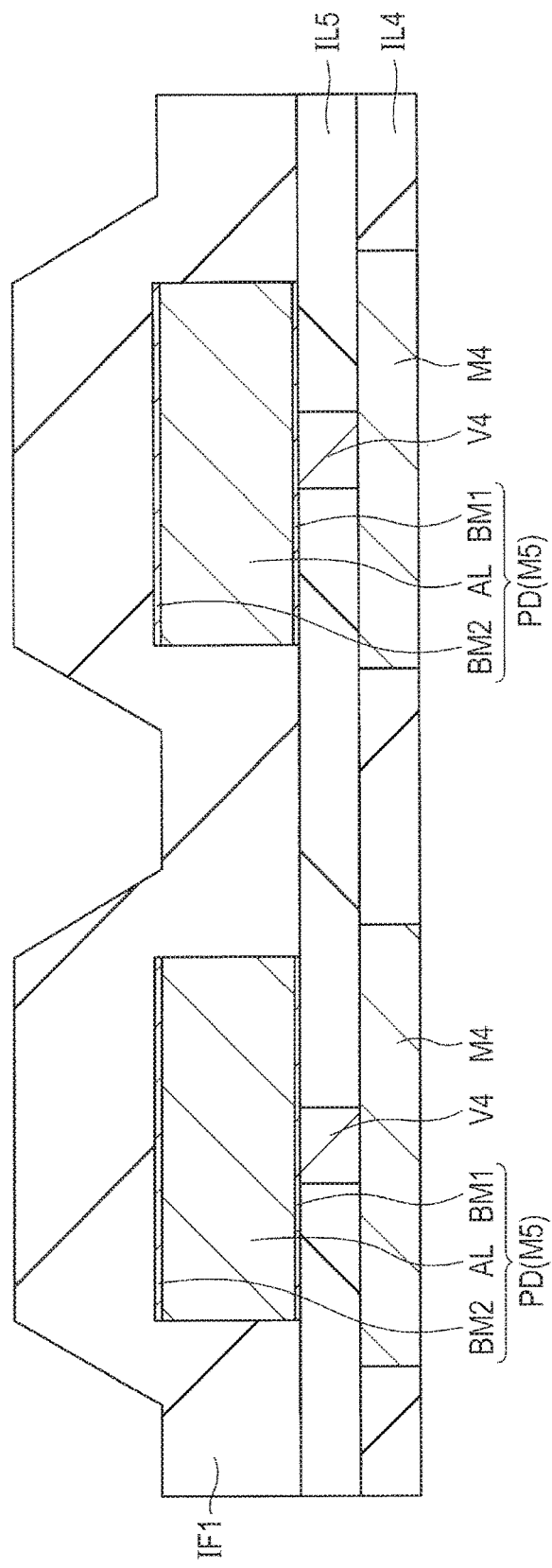
FIG. 9 is a fragmentary sectional view of a semiconductor device according to a second embodiment of the invention.

First, as shown in FIG. 9, an insulating film IF1 is formed over the interlayer insulating film IL5 in a manner to cover the pad electrode PD. The insulating film IF1 is formed, for example, by the HDP-CVD method and, for example, made of silicon oxide. The thickness of the insulating film IF1 is about 1500 to 2500 nm. Unlike the first embodiment, an insulating film IF2 is not formed at this time.

Figure 10:
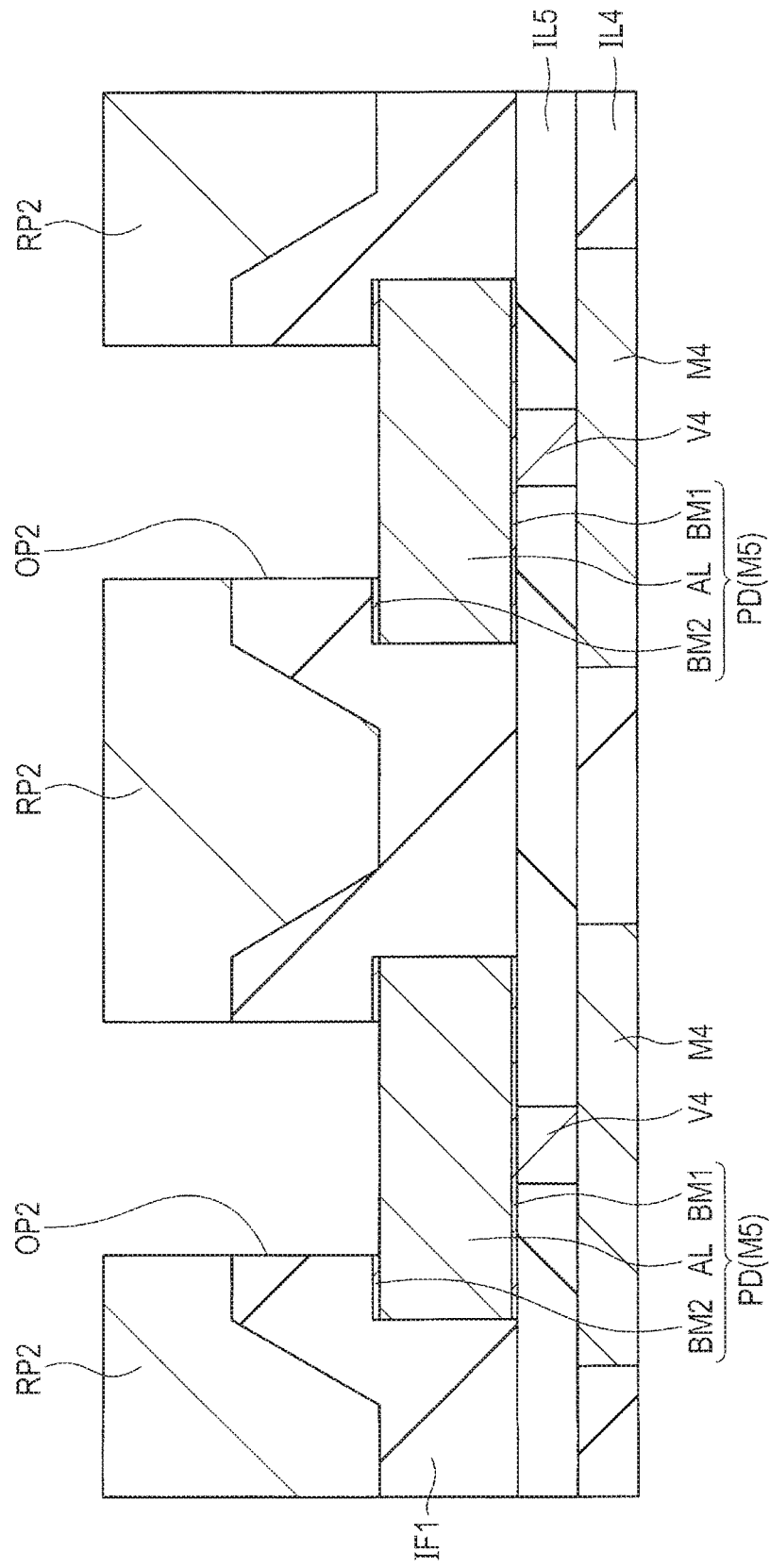
FIG. 10 is a sectional view of the semiconductor device under manufacture or at a manufacturing step following the step shown in FIG. 9.

Then, as shown in FIG. 10, a resist pattern RP2 is formed over the insulating film IF1 in a manner to make an opening in part of the pad electrode PD. Then, the insulating film IF1 and the barrier metal film BM2 are sequentially removed by dry etching using the resist pattern RP2 as a mask. Consequently, an opening OP2 is made in the insulating film IF1 and the surface of the conductive film AL is exposed at the bottom of the opening OP2. In short, the exposed portion of the barrier metal film BM2 from the insulating film IF1 is removed.

Then, the resist pattern RP2 is removed by ashing.

Figure 11:
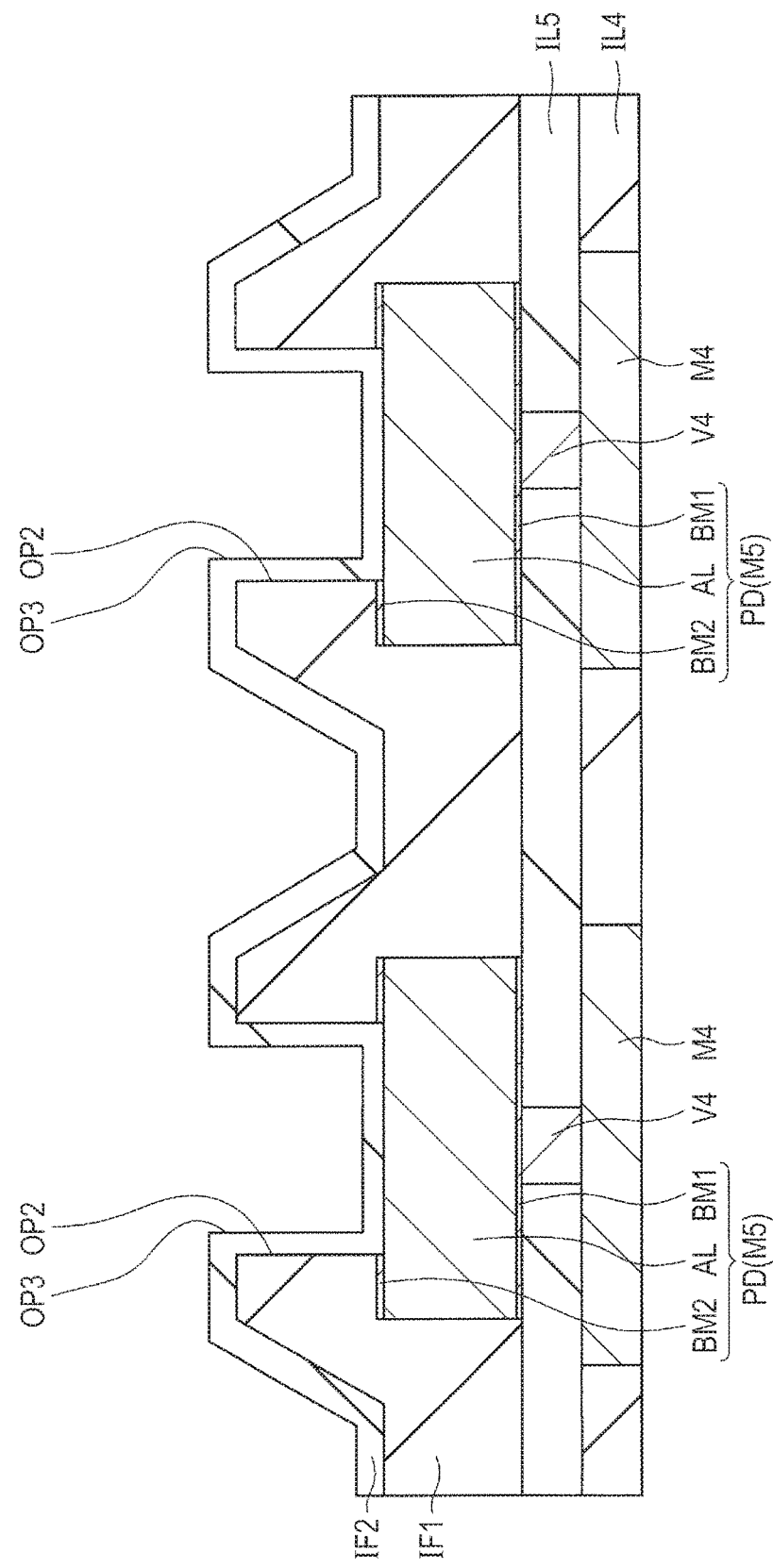
FIG. 11 is a sectional view of the semiconductor device under manufacture or at a manufacturing step following the step shown in FIG. 10.

Then, as shown in FIG. 11, an insulating film IF2 is formed over the upper surface of the insulating film IF1, over the side surfaces of the insulating film IF1 in the opening OP2, and over the exposed portion of the conductive film AL in the opening OP2. The insulating film IF2 is formed, for example, by the CVD method and for example, made of silicon nitride. The thickness of the insulating film IF2 is about 500 to 700 nm. In the second embodiment, preferably the material of the insulating film IF2 is different from the material of the insulating film IF1 and preferably it is more water-resistant than the material of the insulating film IF1. The reason is that it is necessary to prevent moisture or the like from reaching the barrier metal film BM2, which will be explained in detail later.

In description of this embodiment, the surface of the insulating film IF2 formed on the side surfaces of the insulating film IF1 is taken as part of the opening OP3.

Figure 12:
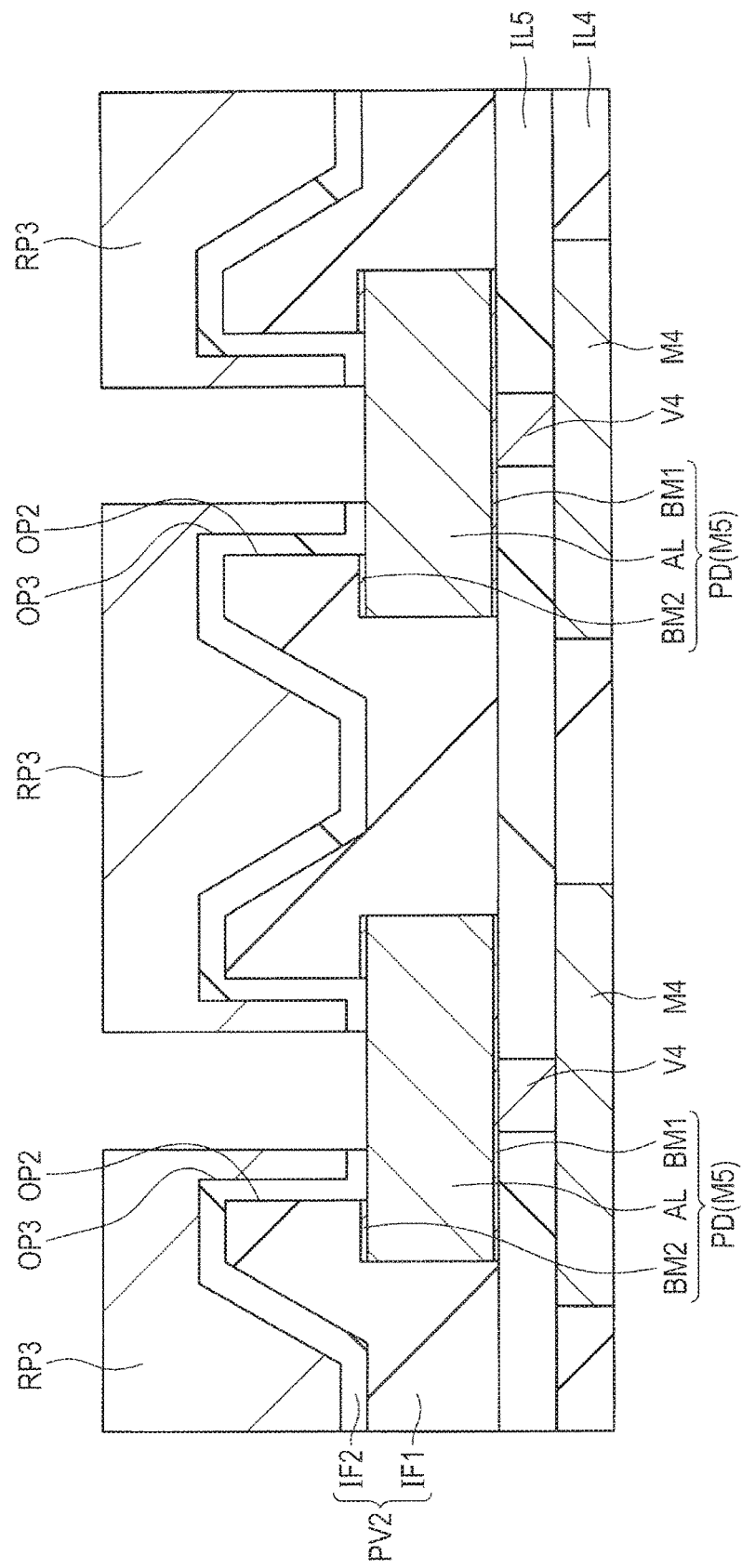
FIG. 12 is a sectional view of the semiconductor device under manufacture or at a manufacturing step following the step shown in FIG. 11.

Then, as shown in FIG. 12, a resist pattern RP3 is formed over the insulating film IF2 in a manner to make an opening in part of the pad electrode PD and lie nearer to the center of the pad electrode PD than the side surfaces of the opening OP3. Then, the insulating film IF2 is removed by dry etching using the resist pattern RP3 as a mask, so as to expose the surface of the conductive film AL. At this time, the insulating film IF2 remains on the side surfaces of the insulating film IF1 and part of the surface of the conductive film AL is covered by the insulating film IF2 at the bottom of the opening OP3.

Then, the resist pattern RP3 is removed by ashing.

The insulating films IF1 and IF2 make up a surface protective film PV2. Like the surface protective film PV1 in the first embodiment, the thickness of the surface protective film PV2 is about 2000 to 3200 nm and larger than the thickness of the conductive layer OPM.

Figure 13:
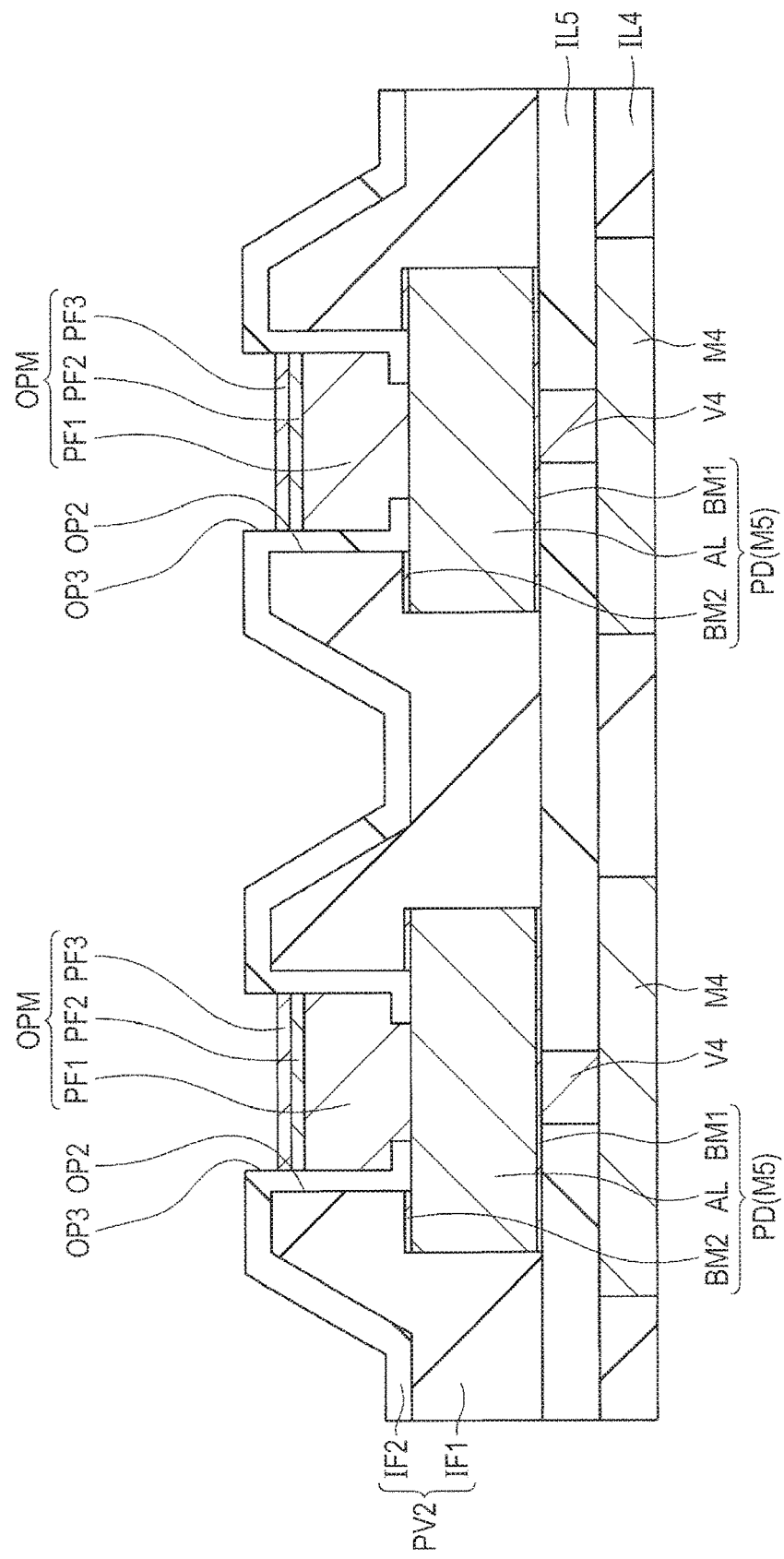
FIG. 13 is a sectional view of the semiconductor device under manufacture or at a manufacturing step following the step shown in FIG. 12.

Then, as shown in FIG. 13, for example, a nickel (Ni)-based conductive film PF1, for example, a palladium (Pd)-based conductive film PF2, and for example, a gold (Au)-based conductive film PF3 are sequentially formed over the exposed surface of the conductive film AL by the electroless plating method so as to form a conductive layer OPM as a laminated film which includes these plating films. Alternatively, the conductive layer OPM may be a laminated film which includes the conductive film PF1 and conductive film PF3 or a laminated film which includes the conductive film PF1 and conductive film PF2. The conductive film PF1 and conductive film PF2 may contain phosphor (P).

The thickness of the conductive film PF1 is about 1800 to 2250 nm, the thickness of the conductive film PF2 is about 100 to 400 nm, and the thickness of the conductive film PF3 is about 20 to 150 nm. Thus, the thickness of the conductive layer OPM is about 1920 to 2800 nm.

The semiconductor device according to the second embodiment is manufactured through the above steps.

Since in the second embodiment the thickness of the surface protective film PV2 is larger than the thickness of the conductive layer OPM as in the first embodiment, the second embodiment brings about almost the same advantageous effects as the first embodiment.

Furthermore, in the second embodiment, the insulating film IF2 is formed in a manner to cover the side surfaces of the insulating film IF1 and the side surfaces of the barrier metal film BM2. This prevents the barrier metal film BM2 from undergoing an electrochemical reaction due to moisture or the like and thereby being oxidized.

For example, in the first embodiment, the side surfaces of the barrier metal film BM2 of titanium nitride, etc. are exposed from the surface protective film PV1. Therefore, if moisture from outside the semiconductor device infiltrates, an electrochemical reaction between the titanium nitride and moisture may occur and generate titanium oxide. Since the volume of the titanium oxide should be larger than the volume of the titanium nitride, the volume of the entire barrier metal film BM2 would expand. If the volume expands considerably, an excessive stress would be applied to the surface protective film PV1, causing the surface protective film PV1 to crack. Moisture from outside the semiconductor device would infiltrate through the crack more easily and corrosion of the conductive film AL of aluminum, etc. might occur.

In the first embodiment, the side surfaces of the barrier metal film BM2 are finally covered by the conductive layer OPM, but the conductive layer OPM is formed not always immediately after making an opening in the surface protective film PV1. In some cases, the semiconductor device is exposed to an atmosphere containing moisture such as the atmospheric air over a few days.

In this embodiment, the side surfaces of the barrier metal film BM2 are covered by the insulating film IF2 in order to avoid this problem. Therefore, the reliability of the semiconductor device can be further improved.

Variation of the Second Embodiment

Next, a variation of the second embodiment will be described referring to FIGS. 14 and 15.

Figure 14:
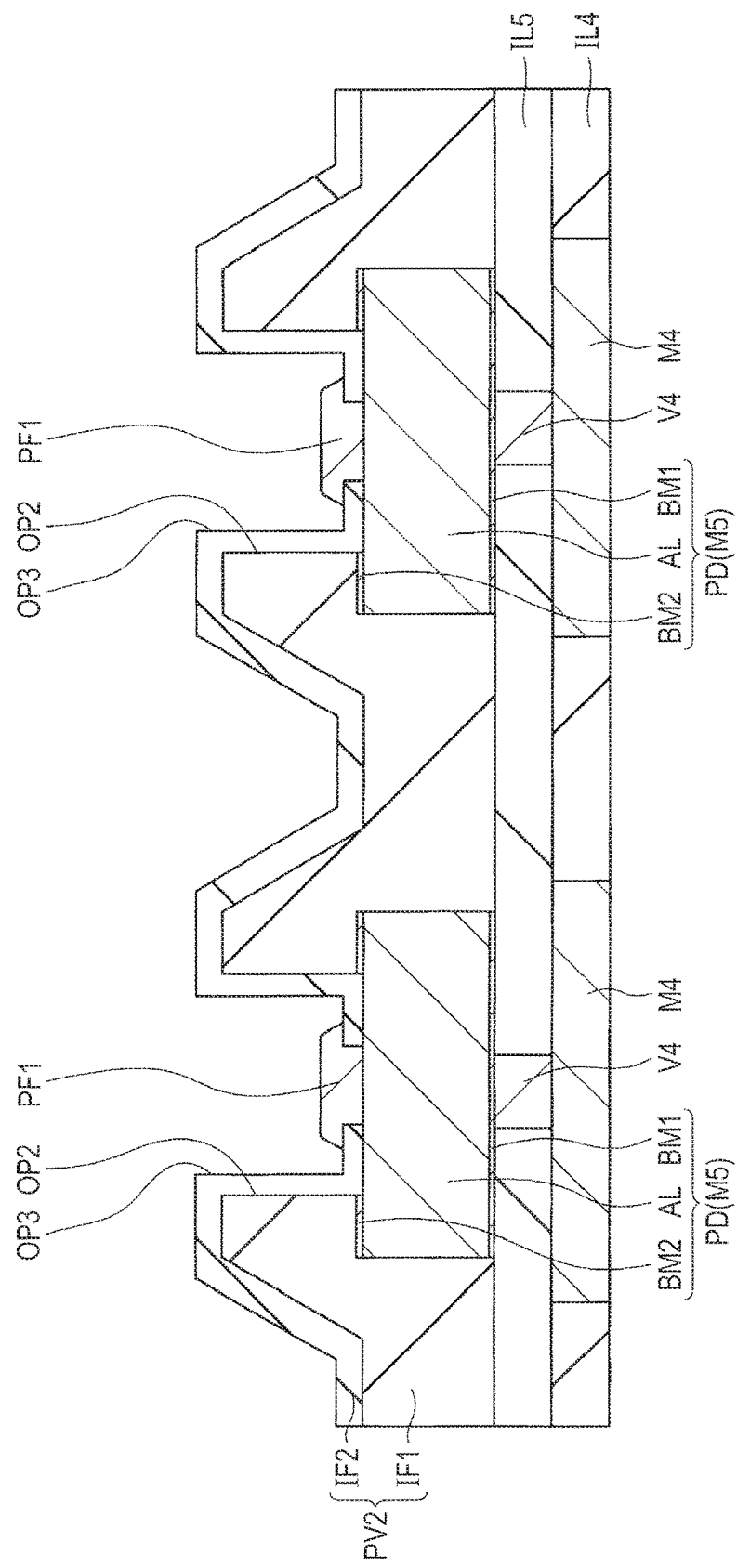
FIG. 14 is a sectional view of a semiconductor device according to a variation of the second embodiment.

As shown in FIG. 14, in this variation too, the conductive film AL is partially covered by the insulating film IF2 and a portion of the conductive film AL is exposed from the ends of the insulating film IF2 as in the second embodiment. In this variation, on the surface of the conductive film AL, the ends of the insulating film IF2 are nearer to the center of the pad electrode PD than the ends of the insulating film IF2 in the second embodiment. This means that on the surface of the conductive film AL, the length of the insulating film IF2 in contact with the conductive film AL is longer in this variation than in the second embodiment.

Next, the method for manufacturing the semiconductor device according to this variation will be described.

In the manufacturing process according to this variation, the earlier steps until the step shown in FIG. 11 are the same as in the second embodiment. At the next step shown in FIG. 12, the length of the insulating film IF2 in contact with the conductive film AL is larger in this variation than in the second embodiment.

Then, as shown in FIG. 14, a conductive film PF1 is formed over the conductive film AL by the electroless plating method.

As mentioned above, basically, when the electroless plating method is used, the insulating film IF2 of silicon nitride, etc. does not reductively react with the plating solution and thus a plating film is not formed over the insulating film IF2. However, as the plating film grows beyond the surface of the insulating film IF2, the plating film slightly grows isotropically in the vertical and horizontal directions. Consequently, the plating film protrudes from the insulating film IF2.

Therefore, when the conductive film PF1 is formed over the conductive film AL by the electroless plating method, the conductive film PF1 protrudes from the insulating film IF2. In this variation, since the length of the insulating film IF2 in contact with the conductive film AL is increased, the conductive film PF1 as a plating film is away from the insulating film IF2 portion lying over the side surfaces of the insulating film IF1 inside the opening OP3 and lies only over the surface of a portion of the insulating film IF2 in contact with the conductive film AL.

Figure 15:
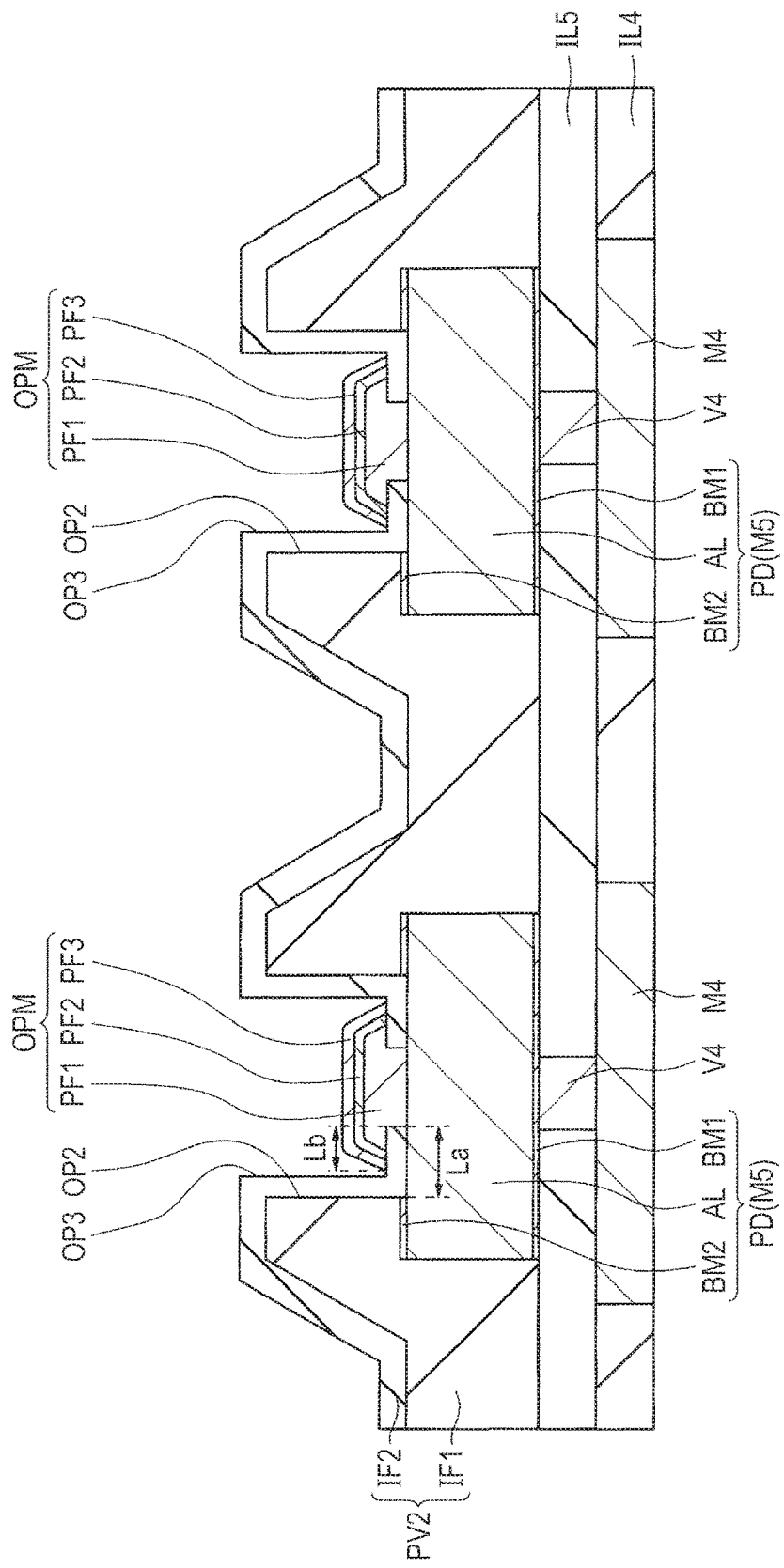
FIG. 15 is a sectional view of the semiconductor device under manufacture or at a manufacturing step following the step shown in FIG. 14.

Then, as shown in FIG. 15, a conductive film PF2 and a conductive film PF3 are sequentially formed by the electroless plating method to form a conductive layer OPM as a laminated film which includes the conductive films PF1 to PF3. The conductive films PF2 and PF3, lying over the surface of the conductive film PF1, are away from the insulating film IF2 portion lying over the side surfaces of the insulating film IF1 and lie only over the surface of a portion of the insulating film IF2 in contact with the conductive film AL. In other words, length La of the insulating film IF2 portion in contact with the conductive film AL is larger than length Lb of the conductive layer OPM portion lying over the insulating film IF2.

Here, length La and length Lb are lengths in the direction horizontal to the surface of the semiconductor substrate or in the direction vertical to the thickness direction of the conductive layer OPM and the thickness direction of the surface protective film PV2.

The semiconductor device according to this variation is manufactured through the above steps.

Thus, in this variation, the conductive layer OPM is not formed in a manner to fill the opening OP3 but lies only on the bottom of the opening OP3. Therefore, the effective distance between neighboring conductive layers OPM is longer than in the second embodiment.

In the back-end process, the semiconductor device is sealed with resin and heat treatment is made on the semiconductor device during the resin sealing step and subsequent durability test. The heat treatment applies thermal stress to the conductive layer OPM, which may cause the conductive layer OPM to expand in volume. Consequently the surface protective film PV2 may crack and moisture may infiltrate through the crack.

In this variation, there is a clearance between the conductive layer OPM and the side surfaces of the opening OP3. The clearance compensates for volumetric expansion of the conductive layer OPM due to thermal stress. Therefore, the reliability of the semiconductor device can be further improved.

The invention made by the present inventors has been so far explained concretely in reference to the preferred embodiments thereof. However, the invention is not limited to the embodiments and these details may be modified in various ways without departing from the gist thereof.

For example, the technique according to Variation 1 (FIG. 7) or Variation 2 (FIG. 8) of the first embodiment can be applied to the second embodiment or the variation of the second embodiment, though not shown. In that case, the reliability of the semiconductor device can be further improved.

The wirings M1 to M4 have been so far described as having a copper-based damascene structure. However, even if the wirings are formed by patterning an aluminum-based conductive film, the same advantageous effects can be achieved.

What is claimed is:

1. A semiconductor device comprising:
   a multilayer wiring layer formed over a semiconductor substrate;
   a pad electrode formed in an uppermost wiring layer of the multilayer wiring layer;
   a surface protective film formed in a manner to cover the pad electrode;
   an opening made in the surface protective film in a manner to expose the pad electrode partially; and
   a conductive layer formed over the pad electrode exposed at a bottom of the opening,
   wherein thickness of the conductive layer formed over the pad electrode is smaller than thickness of the surface protective film formed over the pad electrode,
   wherein the surface protective film is a laminated film which includes a first insulating film formed over the pad electrode in a manner to cover the pad electrode and a second insulating film formed over the first insulating film,
   wherein the pad electrode includes a first barrier metal film, a first conductive film formed over the first barrier metal film, and a second barrier metal film formed over the first conductive film,
   wherein the first insulating film is formed over the second barrier metal film,
   wherein in an area exposed from the first insulating film, the second barrier metal film is removed and the first conductive film is exposed,
   wherein the second insulating film lies over an upper surface and side surfaces of the first insulating film and over side surfaces of the second barrier metal film, and over the first conductive film, in a manner to expose the first conductive film partially,
   wherein the conductive layer lies over the first conductive film and over the second insulating film formed over the first conductive film, and
   wherein thickness of the conductive layer formed over the first conductive film is smaller than a sum of thicknesses of the first insulating film and the second insulating film which are formed over the second barrier metal film.

2. The semiconductor device according to claim 1, wherein length of the second insulating film in contact with the first conductive film is larger than length of the conductive layer formed over the second insulating film.

3. The semiconductor device according to claim 1, wherein the second insulating film is made of a material with a higher water resistance than the first insulating film.

4. The semiconductor device according to claim 1, wherein a third insulating film is formed over the surface protective film in a manner to expose the conductive layer.

5. The semiconductor device according to claim 1, wherein the conductive layer includes a nickel film, a palladium film formed over the nickel film, and a gold film formed over the palladium film.

6. The semiconductor device according to claim 4, wherein the third insulating film is formed in a manner to cover the conductive layer partially and cover the surface protective film.

7. A method for manufacturing a semiconductor device, comprising the steps of:
   (a) forming a pad electrode in an uppermost wiring layer of a multilayer wiring layer over a semiconductor substrate;
   (b) forming a surface protective film covering the pad electrode;
   (c) making an opening in the surface protective film in a manner to expose the pad electrode partially; and
   (d) forming a conductive layer over the pad electrode exposed at a bottom of the opening,
   wherein thickness of the conductive layer formed over the pad electrode is smaller than thickness of the surface protective film formed over the pad electrode, and
   wherein the conductive layer is formed by an electroless plating method.

8. The method for manufacturing a semiconductor device according to claim 7, further comprising the steps of:
   (e) performing plasma treatment on the surface protective film using an inert gas;
   (f) after the step (e), forming a third insulating film over the surface protective film by a CVD method; and
   (g) selectively removing the third insulating film so as to expose the conductive layer,
   wherein the step (e) and the step (f) are successively carried out in a chamber.

9. The method for manufacturing a semiconductor device according to claim 7,
   wherein the conductive layer includes a nickel film, a palladium film formed over the nickel film, and a gold film formed over the palladium film, and
   wherein the nickel film, the palladium film, and the gold film are formed by an electroless plating method.

10. The method for manufacturing a semiconductor device according to claim 8, wherein the third insulating film is formed in a manner to cover the conductive layer partially and cover the surface protective film.

11. A method for manufacturing semiconductor device, comprising the steps of:
   (a) forming a pad electrode including a first barrier metal film, a first conductive film formed over the first barrier metal film, and a second barrier metal firm formed over the first conductive film, in an uppermost wiring layer of a multilayer wiring layer over a semiconductor substrate;
   (b) forming a first insulating film over the second barrier metal film in a manner to cover the pad electrode;
   (c) forming a first resist pattern over the first insulating film;

(d) selectively removing the first insulating film and the second barrier metal film by etching using the first resist pattern as a mask, so as to expose the first conductive film partially;

(e) after the step (d), removing the first resist pattern;

(f) after the step (e), forming a second insulating film in a manner to cover the first insulating film, side surfaces of the second barrier metal film, and the first conductive film;

(g) forming a second resist pattern over the second insulating film;

(h) selectively removing the second insulating film by etching using the second resist pattern as a mask, so as to expose the first conductive film partially and make the second insulating film remain over an upper surface and side surfaces of the first insulating film, over side surfaces of the second barrier metal film, and over the first conductive film;

(i) after the step (h), removing the second resist pattern; and (j) after the step (i), forming a conductive layer over the exposed first conductive film, wherein thickness of the conductive layer formed over the first conductive film is smaller than a sum of thicknesses of the first insulating film and the second insulating film which are formed over the second barrier metal film.

12. The method for manufacturing a semiconductor device according to claim 11, wherein length of the second insulating film in contact with the first conductive film is larger than length of the conductive layer formed over the second insulating film.

13. The method for manufacturing a semiconductor device according to claim 11, wherein the second insulating film is made of a material with a higher water resistance than the first insulating film.

14. The method for manufacturing a semiconductor device according to claim 11, further comprising the steps of:

(k) performing plasma treatment on the second insulating film using an inert gas;

(l) after the step (k), forming a third insulating film over the second insulating film by a CVD method; and (m) selectively removing the third insulating film so as to expose the conductive layer, wherein the step (k) and the step (l) are successively carried out in a chamber.

15. The method for manufacturing a semiconductor device according to claim 11, wherein the conductive layer is formed by an electroless plating method.

16. The method for manufacturing a semiconductor device according to claim 14, wherein the third insulating film is formed in a manner to cover the conductive layer partially and cover the second insulating film.

17. The method for manufacturing a semiconductor device according to claim 15, wherein the conductive layer includes a nickel film, a palladium film formed over the nickel film, and a gold film formed over the palladium film, and wherein the nickel film, the palladium film, and the gold film are formed by the electroless plating method.

* * * * *